US012212146B2

(12) United States Patent
Sridhara et al.

(10) Patent No.: US 12,212,146 B2
(45) Date of Patent: Jan. 28, 2025

(54) SOLAR CELL ASSEMBLY

(71) Applicant: REC SOLAR PTE. LTD., Singapore (SG)

(72) Inventors: Shankar Gauri Sridhara, Singapore (SG); Noel G. Diesta, Singapore (SG); Philipp Johannes Rostan, Singapore (SG); Robert Wade, Kontal (DE)

(73) Assignee: REC SOLAR PTE. LTD., Singapore (SG)

( * ) Notice: Subject to any disclaimer, the term of this patent is extended or adjusted under 35 U.S.C. 154(b) by 54 days.

(21) Appl. No.: 17/956,733

(22) Filed: Sep. 29, 2022

(65) Prior Publication Data
US 2023/0158593 A1 May 25, 2023

Related U.S. Application Data

(63) Continuation of application No. 16/863,492, filed on Apr. 30, 2020, now abandoned, which is a
(Continued)

(30) Foreign Application Priority Data

Jul. 5, 2013 (GB) ...................................... 1312207

(51) Int. Cl.
*H02J 3/46* (2006.01)
*B23H 7/02* (2006.01)
(Continued)

(52) U.S. Cl.
CPC ................ *H02J 3/466* (2020.01); *B23H 7/02* (2013.01); *B23H 7/20* (2013.01); *G05B 19/4155* (2013.01);
(Continued)

(58) Field of Classification Search
CPC .... H02J 3/466; H02J 1/108; H02J 3/38; H02J 3/381; H02J 2300/24; H02J 3/383;
(Continued)

(56) References Cited

U.S. PATENT DOCUMENTS 4,089,705 A 5/1978 Rubin
4,409,537 A 10/1983 Harris
(Continued)

FOREIGN PATENT DOCUMENTS

CN 101304054 11/2008
CN 201478310 5/2010
(Continued)

OTHER PUBLICATIONS

Fuhs and Sieg, "SolarWorld Hits 22 % PERC Efficiency", PV Magazine International, Jan. 14, 2016, 5 pages.
(Continued)

*Primary Examiner* — Mohammad Ali
*Assistant Examiner* — Kelvin Booker
(74) *Attorney, Agent, or Firm* — Lee & Hayes, P.C.

(57) ABSTRACT

A solar cell assembly is presented. The solar cell assembly includes one or more solar cell units coupled in series. The solar cell unit includes a first solar cell series and a second solar cell series connected in parallel. The first and second solar cell series include a plurality of solar cells connecting in series respectively. The solar cell assembly also includes a bypass diode coupled to each solar cell unit and shared between the first and second solar cell series in each solar cell unit.

19 Claims, 10 Drawing Sheets

Related U.S. Application Data continuation of application No. 14/900,942, filed as application No. PCT/IB2014/001251 on Jul. 2, 2014, now Pat. No. 10,749,060.

(51) Int. Cl.

| | | |
|---|---|---|
| *B23H 7/20* | (2006.01) | |
| *G05B 19/41* | (2006.01) | |
| *G05B 19/4155* | (2006.01) | |
| *H01L 31/04* | (2014.01) | |
| *H01L 31/044* | (2014.01) | |
| *H01L 31/0443* | (2014.01) | |
| *H01L 31/05* | (2014.01) | |
| *H02J 1/10* | (2006.01) | |
| *H02J 3/38* | (2006.01) | |
| *H02S 40/34* | (2014.01) | |

(52) U.S. Cl.
CPC ........ *H01L 31/044* (2014.12); *H01L 31/0443* (2014.12); *H01L 31/0504* (2013.01); *H02J 1/108* (2013.01); *H02J 3/38* (2013.01); *H02J 3/381* (2013.01); *H02S 40/34* (2014.12); *G05B 2219/45221* (2013.01); *H02J 2300/24* (2020.01); *Y02E 10/56* (2013.01)

(58) Field of Classification Search
CPC ........ B23H 7/02; B23H 7/20; G05B 19/4155; G05B 2219/45221; H01L 31/044; H01L 31/0443; H01L 31/0504; H02S 40/34; Y02E 10/56; Y02E 10/50
See application file for complete search history.

(56) References Cited

U.S. PATENT DOCUMENTS

| | | | |
|---|---|---|---|
| 5,288,337 A | 2/1994 | Mitchell | |
| 5,290,366 A * | 3/1994 | Riermeier | H01L 31/048 136/251 |
| 6,225,793 B1 * | 5/2001 | Dickmann | H01L 31/044 323/230 |
| 6,268,559 B1 | 7/2001 | Yamawaki | |
| 6,344,612 B1 | 2/2002 | Kuwahara et al. | |
| 6,655,987 B2 | 12/2003 | Higashikozono et al. | |
| 7,658,055 B1 | 2/2010 | Adriani et al. | |
| 7,872,192 B1 | 1/2011 | Fraas et al. | |
| 8,049,096 B2 | 11/2011 | Yagiura et al. | |
| 8,203,200 B2 | 6/2012 | Halstead et al. | |
| 8,569,612 B2 * | 10/2013 | Ger | H01L 31/044 136/255 |
| 8,653,694 B2 | 2/2014 | Hung et al. | |
| 8,656,657 B2 | 2/2014 | Livsey et al. | |
| 8,656,697 B2 | 2/2014 | Zubiate et al. | |
| 8,796,534 B2 | 8/2014 | Van Roosmalen | |
| 8,809,671 B2 | 8/2014 | Linderman et al. | |
| 8,952,672 B2 | 2/2015 | Kernahan | |
| 8,993,900 B2 | 3/2015 | Yamazaki | |
| 9,130,401 B2 | 9/2015 | Adest et al. | |
| 9,373,959 B2 | 6/2016 | Jang et al. | |
| 9,515,214 B2 | 12/2016 | Shimasaki et al. | |
| 10,483,419 B2 | 11/2019 | Nakajima et al. | |
| 2003/0111103 A1 * | 6/2003 | Bower | H02S 40/32 136/244 |
| 2005/0126622 A1 * | 6/2005 | Mukai | H02S 30/10 136/251 |
| 2006/0054212 A1 | 3/2006 | Fraas et al. | |
| 2009/0025778 A1 * | 1/2009 | Rubin | H01L 31/0512 136/246 |
| 2009/0140719 A1 | 6/2009 | Hasenfus | |
| 2009/0217965 A1 | 9/2009 | Dougal et al. | |
| 2009/0242015 A1 | 10/2009 | Wattman et al. | |
| 2010/0012172 A1 | 1/2010 | Meakin et al. | |
| 2010/0078057 A1 * | 4/2010 | Karg | H01L 31/0443 136/244 |
| 2010/0122730 A1 | 5/2010 | Corneille et al. | |
| 2010/0132759 A1 * | 6/2010 | Jia | H01L 31/0201 257/E21.237 |
| 2010/0147364 A1 * | 6/2010 | Gonzalez | H01L 31/044 136/251 |
| 2010/0200045 A1 | 8/2010 | Mitchell | |
| 2010/0200063 A1 | 8/2010 | Djeu | |
| 2011/0011439 A1 | 1/2011 | Hasegawa et al. | |
| 2011/0011641 A1 * | 1/2011 | Pfeffer | H05K 7/20854 174/547 |
| 2011/0061705 A1 | 3/2011 | Croft et al. | |
| 2011/0115297 A1 * | 5/2011 | de Waal | H01L 31/02021 307/77 |
| 2011/0121441 A1 * | 5/2011 | Halstead | H01L 24/37 257/676 |
| 2011/0132431 A1 | 6/2011 | Linderman et al. | |
| 2011/0156883 A1 | 6/2011 | Balbo Di Vinadio et al. | |
| 2011/0265859 A1 * | 11/2011 | Safir | H01L 27/1421 257/E31.117 |
| 2011/0271999 A1 | 11/2011 | Almogy et al. | |
| 2011/0273015 A1 | 11/2011 | Adest et al. | |
| 2011/0284052 A1 | 11/2011 | Croft et al. | |
| 2012/0024337 A1 | 2/2012 | Bellacicco et al. | |
| 2012/0060895 A1 | 3/2012 | Rubin et al. | |
| 2012/0080078 A1 | 4/2012 | Farrelly et al. | |
| 2012/0103387 A1 | 5/2012 | Fischer et al. | |
| 2012/0152302 A1 | 6/2012 | DeGraaff et al. | |
| 2012/0160297 A1 * | 6/2012 | Yamakawa | H01L 31/02021 361/104 |
| 2012/0204924 A1 | 8/2012 | Nowlan et al. | |
| 2012/0222726 A1 * | 9/2012 | Qin | H01L 31/02008 136/251 |
| 2012/0274389 A1 * | 11/2012 | Ger | H01L 31/044 327/504 |
| 2012/0298166 A1 * | 11/2012 | Chen | H01L 31/044 136/244 |
| 2012/0318318 A1 | 12/2012 | Metin et al. | |
| 2012/0318319 A1 * | 12/2012 | Pinarbasi | H01L 31/0201 257/E33.001 |
| 2013/0098423 A1 | 4/2013 | Shimasaki et al. | |
| 2013/0206203 A1 * | 8/2013 | Lommasson | H01L 31/044 438/59 |
| 2013/0284241 A1 | 10/2013 | Georgi et al. | |
| 2014/0042815 A1 | 2/2014 | Maksimovic et al. | |
| 2014/0053890 A1 | 2/2014 | Yang | |
| 2014/0060610 A1 * | 3/2014 | Moslehi | H01L 27/1421 136/255 |
| 2014/0102507 A1 | 4/2014 | Young | |
| 2014/0102531 A1 * | 4/2014 | Moslehi | H01L 31/049 136/256 |
| 2014/0261636 A1 | 9/2014 | Anderson | |
| 2014/0305485 A1 | 10/2014 | Kuramoto et al. | |
| 2014/0326295 A1 * | 11/2014 | Moslehi | H01L 31/0201 438/59 |
| 2015/0068592 A1 * | 3/2015 | Kommera | H01L 31/0682 136/256 |
| 2015/0101761 A1 * | 4/2015 | Moslehi | E06B 9/386 160/107 |
| 2015/0171240 A1 * | 6/2015 | Kapur | H01L 31/0516 438/98 |
| 2015/0236182 A1 * | 8/2015 | Moslehi | H01L 31/02245 136/249 |
| 2020/0313605 A1 * | 10/2020 | Diesta | H02S 30/10 |
| 2021/0043788 A1 | 2/2021 | Sridhara et al. | |
| 2023/0158593 A1 * | 5/2023 | Sridhara | H01L 31/0504 700/162 |

FOREIGN PATENT DOCUMENTS

| | | |
|---|---|---|
| CN | 101013731 | 2/2011 |
| CN | 102024865 | 4/2011 |
| CN | 102044587 A | 5/2011 |
| CN | 102111090 | 6/2011 |
| CN | 201859877 U | 6/2011 |
| CN | 102201471 | 9/2011 |
| CN | 102439722 | 5/2012 |
| CN | 202384370 | 8/2012 |

(56) References Cited

FOREIGN PATENT DOCUMENTS

| | | |
|---|---|---|
| CN | 202384370 U | 8/2012 |
| CN | 202423319 | 9/2012 |
| CN | 202423319 U | 9/2012 |
| CN | 102709372 | 10/2012 |
| CN | 102761290 | 10/2012 |
| CN | 102820341 | 12/2012 |
| CN | 202585481 | 12/2012 |
| CN | 202585481 U | 12/2012 |
| CN | 102881752 A | 1/2013 |
| CN | 102959723 | 3/2013 |
| CN | 103094381 A | 5/2013 |
| CN | 202948942 | 5/2013 |
| DE | 20200811461 U1 | 1/2010 |
| DE | 102009054039 | 12/2010 |
| DE | 202011000923 U1 | 10/2011 |
| DE | 202012004369 U1 | 5/2012 |
| DE | 202012004526 | 6/2012 |
| DE | 102011055754 A1 | 12/2012 |
| DE | 102011105019 A1 | 12/2012 |
| DE | 112010005717 | 6/2013 |
| DE | 102012207168 | 10/2013 |
| EP | 1045455 A2 | 10/2000 |
| EP | 1564816 A1 | 8/2005 |
| EP | 1717866 A2 | 2/2006 |
| EP | 1744372 | 1/2007 |
| EP | 1816684 A2 | 8/2007 |
| EP | 2341717 | 7/2011 |
| EP | 2511959 | 10/2012 |
| EP | 2546947 | 10/2012 |
| ES | 2285979 T3 | 12/2007 |
| JP | H07302923 A | 11/1995 |
| JP | H08186280 A | 7/1996 |
| JP | 2000068547 | 3/2000 |
| JP | 2000114567 | 4/2000 |
| JP | 2001135847 | 5/2001 |
| JP | 2001339088 | 12/2001 |
| JP | 2002057360 | 2/2002 |
| JP | 2002289893 | 10/2002 |
| JP | 2003-078155 | 3/2003 |
| JP | 2003-282916 | 10/2003 |
| JP | 2004289181 | 10/2004 |
| JP | H10256584 A | 1/2005 |
| JP | 2006332353 | 12/2006 |
| JP | 05207592 B2 | 9/2007 |
| JP | 2007235113 A | 9/2007 |
| JP | 2010165993 A | 7/2010 |
| JP | 2011159749 A | 8/2011 |
| JP | 2013048166 A | 3/2013 |
| JP | 2013251286 A | 12/2013 |
| KR | 20130011116 A | 1/2013 |
| WO | 20050112133 | 11/2005 |
| WO | 20090112019 A | 9/2009 |
| WO | 20090140521 | 11/2009 |
| WO | 20100135801 A | 12/2010 |
| WO | 20110032693 A2 | 3/2011 |
| WO | 20110044759 A1 | 4/2011 |
| WO | 20120026822 A1 | 3/2012 |
| WO | 20130075144 A1 | 5/2013 |
| WO | 20120001815 A | 8/2013 |
| WO | 20130105472 A1 | 5/2015 |

OTHER PUBLICATIONS

Guo, Siyu et al; Analysing partial shading of PV modules by circuit modelling; 38th IEEE Photovoltaic Specialists Conference, (2012) DOI: 10.1109/PVSC.2012.6318205 (4 pages).
"Half Cell Modules Increase the Output", BINE Information Service, retrieved Apr. 20, 2020 from <<http:http://www.bine.info/en/publications/publikation/hocheffiziente-solarzellen-und-module-entwickeln/halbzellmodule-steigern-leistung/>>, 2 pages.
"How to Choose a Bypass Diode for a Silicon Panel Junction Box"; STMicroelectronics; XP55453067; Sep. 2011; pp. 1-24.
Information Offer filed in the Japan Patent Office in Application No. JP 2016-522888 dated Nov. 20, 2018 (2 pages).
IPR 2021-00988, Exhibit 1003—Declaration of Joseph Kimball, filed Jun. 2, 2021, *Hanwha Solutions Corporation et al v. REC Solar Pte. Ltd.* (139 pages).
IPR 2021-00989, Exhibit 1026—U.S. Patent Appln. Pub. No. 2006/0054212 A1 to Fraas et al., filed Jun. 2, 2021, *Hanwha Solutions Corporation et al v. REC Solar Pte. Ltd.* (16 pages).
IPR 2021-00988, Exhibit 1037—JP Patent App. Pub. No. 2010-165993 to Ito, filed Jun. 23, 2022, *Hanwha Solutions Corporation et al v. REC Solar Pte. Ltd.* (12 pages).
IPR 2021-00988, Exhibit 1038—English translation of JP Patent App. Pub. No. 2010-165993 to Ito, filed Jun. 23, 2022, *Hanwha Solutions Corporation et al v. REC Solar Pte. Ltd.* (18 pages).
IPR 2021-00988, Exhibit 1045—Solarex Data sheet MSX-60 and MX-64 Photovoltaic Modules, filed Jun. 23, 2022, *Hanwha Solutions Corporation et al v. REC Solar Pte. Ltd.* (4 pages).
IPR 2021-00988, Exhibit 1046—Solarex Datasheet re Mega Modules Over 39 Watts, filed Jun. 23, 2022, *Hanwha Solutions Corporation et al v. REC Solar Pte. Ltd.* (6 pages).
IPR 2021-00988, Exhibit 1047—Solarex Datasheet re BP MSX 120, filed Jun. 23, 2022, *Hanwha Solutions Corporation et al v. REC Solar Pte. Ltd.* (4 pages).
IPR 2021-00988, Exhibit 1049—Annotated Yagiura Figures, filed Jun. 23, 2022, *Hanwha Solutions Corporation et al v. REC Solar Pte. Ltd.* (3 pages).
IPR 2021-00988, Exhibit 1048—Suniva Datasheet, filed Jun. 23, 2022, *Hanwha Solutions Corporation et al v. REC Solar Pte. Ltd.* (2 pages).
IPR 2021-00988, Exhibit 1050—Modified and Annotated Wu Figures, filed Jun. 23, 2022, *Hanwha Solutions Corporation et al v. REC Solar Pte. Ltd.* (1 page).
IPR 2021-00988, Exhibit 1051—U.S. Pat. No. 10,753,388 to Gibson et al, filed Jun. 23, 2022, *Hanwha Solutions Corporation et al v. REC Solar Pte. Ltd.* (38 pages).
IPR 2021-00988, Exhibit 1053—Deposition Transcript of Stephen Patrick Shea, filed Jun. 23, 2022, *Hanwha Solutions Corporation et al v. REC Solar Pte. Ltd.* (78 pages).
IPR 2021-00988, Exhibit 1054—Reply Declaration of Jonathan Kimball, Ph.D., on Behalf of Petitioners, filed Jun. 23, 2022 *Hanwha Solutions Corporation et al v. REC Solar Pte. Ltd.* (113 pages).
IPR 2021-00988, Exhibit 1055—Production and Manufacturing Engineering Technologies for Solar Photovoltaic Modules, Li, Post & Telecom Press (2012), filed Jun. 23, 2022, *Hanwha Solutions Corporation et al v. REC Solar Pte. Ltd.* (36 pages).
IPR 2021-00988, Exhibit 1056—English-language translation of Production and Manufacturing Engineering Technologies for Solar Photovoltaic Modules, Li, Post & Telecom Press (2012), filed Jun. 23, 2022, *Hanwha Solutions Corporation et al v. REC Solar Pte. Ltd.* (60 pages).
IPR 2021-00988, Exhibit 1057—Excerpt of Williams, A.F., The Handbook of Photovoltaic Applications, Building Applications and System Design Considerations, The Fairmont Press, Inc., filed Jun. 23, 2022, *Hanwha Solutions Corporation et al v. REC Solar Pte. Ltd.* (12 pages).
IPR 2021-00988, Exhibit 1058—Wayback Letter to Exhibitor, Inter Solar Award (2015), filed Jun. 23, 2022, *Hanwha Solutions Corporation et al v. REC Solar Pte. Ltd.* (6 pages).
IPR 2021-00988, Exhibit 1059—Press Release, Inter Solar Europe, Munich, (Jun. 2015), filed Jun. 23, 2021, *Hanwha Solutions Corporation et al v. REC Solar Pte. Ltd.* (4 pages).
IPR 2021-00988, Exhibit 1060—Excerpt from Lackie, J. (1986), Chambers Dictionary of Science and Technology, filed Jun. 23, 2021, *Hanwha Solutions Corporation et al v. REC Solar Pte. Ltd.* (3 pages).
IPR 2021-00988, Exhibit 1061—JP Patent No. 4925844 to Yaglura, filed Jun. 23, 2022, *Hanwha Solutions Corporation et al v. REC Solar Pte. Ltd.* (15 pages).
IPR 2021-00988, Exhibit 1062—English-language translation of JP Patent No. 4925844 to Yagiura filed Jun. 23, 2022, *Hanwha Solutions Corporation et al v. REC Solar Pte. Ltd.* (16 pages).
IPR 2021-00988, Exhibit 1063—CN Patent No. 101013731 to Yagiura, filed Jun. 23, 2022, *Hanwha Solutions Corporation et al v. REC Solar Pte. Ltd.* (22 pages).

(56) References Cited

OTHER PUBLICATIONS

IPR 2021-00988, Exhibit 1064—Certified English translation of CN Patent No. 101013731 to Yaglura, filed Jun. 23, 2022, *Hanwha Solutions Corporation et al v. REC Solar Pte. Ltd.* (28 pages).
IPR 2021-00988, Exhibit 1065—Pictures of SunWize Technologies SW-S85P Photovoltaic Module, filed Jun. 23, 2022, *Hanwha Solutions Corporation et al v. REC Solar Pte. Ltd.* (13 pages).
IPR 2021-00988, Exhibit 1066—Excerpt from Deambi, S. (2015), A Practical Handbook on Solar Photovoltaic Applications, The Energy and Resources Institute, 3rd. Ed., filed Jun. 23, 2022, *Hanwha Solutions Corporation et al v. REC Solar Pte. Ltd.* (30 pages).
IPR 2021,00988, Exhibit 1067—Excerpt from Sears, et al (1987), Current, Resistance, and Electromotive Force, University Physics, 7th Ed., filed Jun. 23, 2022, *Hanwha Solutions Corporation et al v. REC Solar Pte. Ltd.* (52 pages).
IPR 2021-00988, Exhibit 1068—BP Solar BP3280T Datasheet, filed Jun. 23, 2022, *Hanwha Solutions Corporation et al v. REC Solar Pte. Ltd.* (2 pages).
IPR 2021-00988, Exhibit 1069—About Jonathan Kimball, Missoury S&T Webpage, filed Jun. 23, 2022, *Hanwha Solutions Corporation et al v. REC Solar Pte. Ltd.* (3 pages).
IPR 2021-00988, Exhibit 1070—Bosch Solar Module c—Si M 60+ Datasheet, filed Jun. 23, 2022, *Hanwha Solutions Corporation et al v. REC Solar Pte. Ltd.* (2 pages).
IPR 2021-00988, Exhibit 1071—Mitsubishi Electric Photovoltaic Modules, filed Jun. 23, 2022, *Hanwha Solutions Corporation et al v. REC Solar Pte. Ltd.* (2 pages).
IPR 2021-00988, Exhibit 1072—Excerpt of McGraw Hill, Dictionary of Electronic and Computer Engineering (2003), filed Jun. 23, 2022, *Hanwha Solutions Corporation et al v. REC Solar Pte. Ltd.* (3 pages).
IPR 2021-00988, Exhibit 1073—Excerpt from Wiley Electrical and Electronics Engineering Dictionary (2004), IEEE Press, filed Jun. 23, 2022, *Hanwha Solutions Corporation et al v. REC Solar Pte. Ltd.* (4 pages).
IPR 2021-00988, Exhibit 1074—CN Patent No. 202111130 to Huang, filed Jun. 23, 2022, *Hanwha Solutions Corporation et al v. REC Solar Pte. Ltd.* (9 pages).
IPR 2021-00988, Exhibit 1075—English-language translation of CN Patent No. 202111130 to Huang, filed Jun. 23, 2022, *Hanwha Solutions Corporation et al v. REC Solar Pte. Ltd.* (13 pages).
IPR 2021-00988, Exhibit 1076—CN Patent No. 201742341 to Huang, filed Jun. 23, 2022, *Hanwha Solutions Corporation et al v. REC Solar Pte. Ltd.* (7 pages).
IPR 2021-00988, Exhibit 1077—English-language translation of CN Patent No. 201742341 to Huang, filed Jun. 23, 2022, *Hanwha Solutions Corporation et al v. REC Solar Pte. Ltd.* (9 pages).
IPR 2021-00988, Exhibit 2001—Text of Hanwha's Request for Invalidation of CN Appl. No. 201400038577.X, filed Sep. 16, 2021, *Hanwha Solutions Corporation et al v. REC Solar Pte. Ltd.* (54 pages).
IPR 2021-00988, Exhibit 2002—Certified English Translation of Hanwha's Request for Invalidation of CN Appl. No. 201400038577. X, filed Sep. 16, 2021, *Hanwha Solutions Corporation et al v. REC Solar Pte. Ltd.* (30 pages).
IPR 2021-00988, Exhibit 2003—Decision on Hanwha's Request for Invalidation of CN Appl. No. 201400038577.X, filed Sep. 16, 2021, *Hanwha Solutions Corporation et al v. REC Solar Pte. Ltd.* (23 pages).
IPR 2021-00988, Exhibit 2004—Certified English Translation of Decision on Hanwha's Request for Invalidation of CN Appl. No. 201400038577.X, filed Sep. 16, 2021, *Hanwha Solutions Corporation et al v. REC Solar Pte. Ltd.* (24 pages).
IPR 2021-00988, Exhibit 2006—Complaint filed by Hanwhat Q Cells USA, Inc., ITC No. 337-TA-3369, filed Sep. 16, 2021, *Hanwha Solutions Corporation et al v. REC Solar Pte. Ltd.* (57 pages).
IPR 2021-00988, Exhibit 2007—Complaint for Patent Infringement, Case No. 20:cv-01622, D.Del, filed Sep. 16, 2021, *Hanwha Solutions Corporation et al v. REC Solar Pte. Ltd.* (16 pages).
IPR 2021-00988, Exhibit 2008—Defendant's Responses and Objectiontions to Plaintiff's First Set of Interrogatorries, filed Sep. 16, 2021, *Hanwha Solutions Corporation et al v. REC Solar Pte. Ltd.* (24 pages).
IPR 2021-00988, Exhibit 2009—Press Release, Hanwha Q Cells Media Statement Regarding REC Group patent infringement lawsuit (2020), filed Sep. 16, 2021, *Hanwha Solutions Corporation et al v. REC Solar Pte. Ltd.* (2 pages).
IPR 2021-00988, Exhibit 2011—Hearing Transcript in *Nuance Communications, Inc. v. MModal, LLC* (Case No. CA No. 17-1484, D. Del.), Apr. 8, 2019, Motion to Stay Hearing, filed Sep. 16, 2021, *Hanwha Solutions Corporation et al v. REC Solar Pte. Ltd.* (34 pages).
IPR 2021-00988, Exhibit 2014—Press Release, REC receives prestigious Intersolar Award 2015 for its new REC TwinPeak panels (2015), filed Oct. 13, 2021, *Hanwha Solutions Corporation et al v. REC Solar Pte. Ltd.* (3 pages).
IPR 2021-00988, Exhibit 2015—Press Release, Press Release, Intersolar AWARD 2015 winner in the category "Photovoltaics" with their REC TwinPeak Series (2017), filed Oct. 13, 2021, *Hanwha Solutions Corporation et al v. REC Solar Pte. Ltd.* (2 pages).
IPR 2021-00988, Exhibit 2016—Peschel, T. (2015), REC Solar wins Intersolar Award with TwinPeak module, filed Oct. 13, 2021, *Hanwha Solutions Corporation et al v. REC Solar Pte. Ltd.* (2 pages).
IPR 2021-00988, Exhibit 2018—Alexander, C.K. et al (2007), Excerpts from Fundamentals of electric circuits, Third Ed., The McGraw-Hill Co., filed Oct. 13, 2021, *Hanwha Solutions Corporation et al v. REC Solar Pte. Ltd.* (3 pages).
IPR 2021-00988, Exhibit 2019—Bridge Circuit Diagram, filed Oct. 13, 2021, *Hanwha Solutions Corporation et al v. REC Solar Pte. Ltd.* (1 page).
IPR 2021-00988, Exhibit 2021—Messenger, R.A. et al.(2010), Photovoltaic Systems Engineering, Third Ed., CRC Press, filed Mar. 23, 2022, *Hanwha Solutions Corporation et al v. REC Solar Pte. Ltd.* (490 pages).
IPR 2021-00988, Exhibit 2022—Deposition of Jonathan Kimball, Ph.D., taken Mar. 11, 2022, filed Mar. 23, 2022, *Hanwha Solutions Corporation et al v. REC Solar Pte. Ltd.* (57 pages).
IPR 2021-00988, Exhibit 2023—Press Release, REC Launches High-Performance TwinPeak Series Solar Panels for Major Rooftop Markets Worldwide (2014) filed Mar. 23, 2022, *Hanwha Solutions Corporation et al v. REC Solar Pte. Ltd.* (1 page).
IPR 2021-00988, Exhibit 2024—Press Release, Intersolar 2015: REC Showcases Excellence With New Products, New Applications and New Budding Markets (2015) filed Mar. 23, 2022, *Hanwha Solutions Corporation et al v. REC Solar Pte. Ltd.* (1 page).
IPR 2021-00988, Exhibit 2025—The Intersolar Award—Powering the Future With Innovation (2021), https://www.intersolar-award. com/en/?print=1&cHash=b1fe1ba83f77d39dff19f3b1202c8e84, filed Mar. 23, 2022, *Hanwha Solutions Corporation et al v. REC Solar Pte. Ltd.* (3 pages).
IPR 2021-00988, Exhibit 2026—Beetz, B. (2022), Sonnenstromfabrik plans 300MW solar module line in Germany with patented REC tech, PV Magazine, filed Mar. 23, 2022, *Hanwha Solutions Corporation et al v. REC Solar Pte. Ltd.* (5 pages).
IPR 2021-00988, Exhibit 2027—Claim Chart, Nexus Between Intersolar Award Winning REC TwinPeak Series and U.S. Pat. No. 10,749,060, filed Mar. 23, 2022, *Hanwha Solutions Corporation et al v. REC Solar Pte. Ltd.* (77 pages).
IPR 2021-00988, Exhibit 2028—Datasheet for REC TwinPeak Series, filed Mar. 23, 2022, *Hanwha Solutions Corporation et al v. REC Solar Pte. Ltd.* (2 pages).
IPR 2021-00988, Exhibit 2029—Whitepaper, The new REC TwinPeak Series: The combination of different technologies maximizes the power from a polycrystalline platform and optimizes long term panel performance (undated), filed Mar. 23, 2022, *Hanwha Solutions Corporation et al v. REC Solar Pte. Ltd.* (2 pages).

(56) References Cited

OTHER PUBLICATIONS

IPR 2021-00988, Exhibit 2030—The REC TwinPeak Series: Innovative module design gives improved yield performance in shaded conditions (undateD), filed Mar. 23, 2022, *Hanwha Solutions Corporation et al v. REC Solar Pte. Ltd.* (2 pages).

IPR 2021-00988, Exhibit 2031—EP Patent No. 3 017 520 B1 to Sridhara et al, filed Mar. 23, 2022, *Hanwha Solutions Corporation et al v. REC Solar Pte. Ltd.* (18 pages).

IPR 2021-00988, Exhibit 2034—Joint Press Release, REC Group and Sonnenstromfabrik to expand their cooperation (2022), filed Mar. 23, 2022, *Hanwha Solutions Corporation et al v. REC Solar Pte. Ltd.* (2 pages).

IPR 2021-00988, Exhibit 2035—Vieira, R.G et al (2020), A comprehensive review on bypass diode application on photovoltaic modules, Energies, vol. 13, 2472, filed Mar. 23, 2022, *Hanwha Solutions Corporation et al v. REC Solar Pte. Ltd.* (22 pages).

IPR 2021-00988, Exhibit 2036—U.S. Patent Appln. Pub. No. 2016/0118935 to Posbic et al, filed Mar. 23, 2022, *Hanwha Solutions Corporation et al v. REC Solar Pte. Ltd.* (12 pages).

IPR 2021-00988, Exhibit 2037, BP 7175 Datasheet, filed Mar. 23, 2022, *Hanwha Solutions Corporation et al v. REC Solar Pte. Ltd.* (2 pages).

IPR 2021-00988, Exhibit 2038—Q.Peak Duo BLK-G10+ Datasheet, filed Mar. 23, 2022, *Hanwha Solutions Corporation et al v. REC Solar Pte. Ltd.* (2 pages).

IPR 2021-00988, Exhibit 2039—CanadianSolar, Installation Manual of Standard Solar Modules (2020), filed Mar. 23, 2022, *Hanwha Solutions Corporation et al v. REC Solar Pte. Ltd.* (47 pages).

IPR 2021-00988, Exhibit 2040—Declaration of Dr. Stephen P. Shea, filed Mar. 23, 2022, *Hanwha Solutions Corporation et al v. REC Solar Pte. Ltd.* (114 pages).

IPR 2021-00988, Paper No. 30, Patent Owner's Sur-Reply filed Aug. 3, 2022, *Hanwha Solutions Corporation et al v. REC Solar Pte. Ltd.* (36 pages).

IPR 2021-00988, Exhibit 3001, Excerpt from The Authoritative Dictionary of IEEE Standard Terms, Seventh Ed., 2000, filed Nov. 9, 2022, *Hanwha Solutions Corporation et al v. REC Solar Pte. Ltd.* (3 pages).

IPR 2021-00988, Exhibit 3002, History of IEEE, retrieved from https://www.ieee.org/about/ieee-history.html, filed Nov. 9, 2022, *Hanwha Solutions Corporation et al v. REC Solar Pte. Ltd.* (4 pages).

IPR 2021-00988, Exhibit 3003, Excerpt from Gibilisco, S. (2022), The Illustrated Dictionary of Electronics, McGraw-Hill, filed Nov. 9, 2022, *Hanwha Solutions Corporation et al v. REC Solar Pte. Ltd.* (5 pages).

IPR 2021-00988, Exhibit 3004, Excerpt from Amos, S.W., et al (1999), Newnew Dictionary of Electronics, Fourth Ed., filed Nov. 9, 2022, *Hanwha Solutions Corporation et al v. REC Solar Pte. Ltd.* (3 pages).

IPR 2021-00988, Paper No. 1, Petitioner's Power of Attorney, filed Jun. 2, 2021, *Hanwha Solutions Corporation et al v. REC Solar Pte. Ltd.* (3 pages).

IPR 2021-00988, Paper No. 10, Patent Owner's Sur-Reply in Support of Patent Owner's Preliminary Response filed Oct. 13, 2021, *Hanwha Solutions Corp. et al v. REC Solar Pte. Ltd.* (18 pages).

IPR 2021-00988, Paper No. 12, Decision Granting Institution of Inter Partes Review dated Dec. 13, 2021, *Hanwha Solutions Corp. et al v. REC Solar Pte. Ltd.* (30 pages).

IPR 2021-00988, Paper No. 2, Petitioner's Fee Authorization filed Jun. 2, 2021, *Hanwha Solutions Corporation et al v. REC Solar Pte. Ltd.* (1 page).

IPR 2021-00988, Paper No. 22, Patent Owner's Response filed Mar. 23, 2022, *Hanwha Solutions Corporation et al v. REC Solar Pte. Ltd.* (77 pages).

IPR 2021-00988, Paper No. 26, Petitioner's Reply filed Jun. 23, 2022, *Hanwha Solutions Corporation et al v. REC Solar Pte. Ltd.* (38 pages).

IPR 2021-00988, Paper No. 3, Petitioner's Petition Ranking and Explanation of Differences filed Jun. 2, 2021, *Hanwha Solutions Corporation et al v. REC Solar Pte. Ltd.* (6 pages).

IPR 2021-00988, Paper No. 36, Patent Owner's Demonstratives filed Sep. 1, 2022, *Hanwha Solutions Corporation et al v. REC Solar Pte. Ltd.* (177 pages).

IPR 2021-00988, Paper No. 37, Petitioner's Demonstrative Exhibits filed Sep. 1, 2022, *Hanwha Solutions Corporation et al v. REC Solar Pte. Ltd.* (100 pages).

IPR 2021-00988, Paper No. 4, Petition for Inter Partes Review of U.S. Pat. No. 10,749,060 Challenging Claims 1-6, 11, and 13, IPR 2021-00989, *Hanwha Solutions Corporation et al v. REC Solar Pte. Ltd.* (100 pages).

IPR 2021-0988, Paper No. 40, Judgment and Final Written Decision dated Dcember 9, 2022, *Hanwha Solutions Corporation et al v. REC Solar Pte. Ltd.* (100 pages).

IPR 2021-00988, Paper No. 7, Patent Owner's Mandatory Notices filed Jun. 17, 2021, *Hanwha Solutions Corporation et al v. REC Solar Pte. Ltd.* (4 pages).

IPR 2021-00988, Paper No. 8, Patent Owner's Preliminary Response filed Sep. 16, 2021, *Hanwha Solutions Corporation et al v. REC Solar Pte. Ltd.* (38 pages).

IPR 2021-00988, Paper No. 9, Petitioner's Reply to Patent Owner's Preliminary Response filed Oct. 6, 2021, *Hanwha Solutions Corporation et al v. REC Solar Pte. Ltd.* (18 pages).

IPR 2021-00989, Exhibit 1103—Declaration of Joseph Kimball filed Jun. 2, 2021, *Hanwha Solutions Corporation et al v. REC Solar Pte. Ltd.* (107 pages).

IPR 2021-00989, Exhibit 1104—CN Utility Model Patent No. CN 202585481U to Huang et al, filed Jun. 2, 2021, *Hanwha Solutions Corporation et al v. REC Solar Pte. Ltd.* (8 pages).

IPR 2021-00989, Exhibit 1105—Certified translation of CN Utility Model Patent No. CN 202585481U to Huang et al, filed Jun. 2, 2021, *Hanwha Solutions Corporation et al v. REC Solar Pte. Ltd.* (10 pages).

Exhibit 1106—China Patent App. Pub. No. CN 102044587A to Wu et al in IPR 2021-00989, filed Jun. 2, 2021, *Hanwha Solutions Corporation et al v. REC Solar Pte. Ltd.* (9 pages).

IPR 2021-00989, Exhibit 1107—Certified Translation of China Patent App. Pub. No. CN 102044587A to Wu et al, filed Jun. 2, 2021, *Hanwha Solutions Corporation et al v. REC Solar Pte. Ltd.* (11 pages).

IPR 2021-00989, Exhibit 1108—CN Patent App. Pub. No. CN 103094318A to Zhang et al, filed Jun. 2, 2021, *Hanwha Solutions Corporation et al v. REC Solar Pte. Ltd.* (9 pages).

IPR 2021-00989, Exhibit 1109—Certified translation of CN Patent App. Pub. No. CN 103094318A to Zhang et al, filed Jun. 2, 2021, *Hanwha Solutions Corporation et al v. REC Solar Pte. Ltd.* (12 pages).

IPR 2021-00989, Exhibit 1110—U.S. Pat. No. 8,049,096B2 to Yagiura et al, filed Jun. 2, 2021, *Hanwha Solutions Corporation et al v. REC Solar Pte. Ltd.* (21 pages).

IPR 2021-00989, Exhibit 1111—U.S. Patent App. Pub. No. 2010/0012172A1 to Meakin et al, filed Jun. 2, 2021, *Hanwha Solutions Corporation et al v. REC Solar Pte. Ltd.* (22 pages).

IPR 2021-00989, Exhibit 1112—JP Patent Pub. No. JP 2010-165993 to Ito, filed Jun. 2, 2021, *Hanwha Solutions Corporation et al v. REC Solar Pte. Ltd.* (13 pages).

IPR 2021-00989, Exhibit 1113—Certified translation of JP Patent Pub. No. JP 2010-165993 to Ito, filed Jun. 2, 2021, *Hanwha Solutions Corporation et al v. REC Solar Pte. Ltd.* (13 pages).

IPR 2021-00989, Exhibit 1114—CN Patent Pub. No. CN 102024865A to Yan, filed Jun. 2, 2021, *Hanwha Solutions Corporation et al v. REC Solar Pte. Ltd.* (8 pages).

IPR 2021-00989, Exhibit 1115—Certified translation of CN Patent Pub. No. CN 102024865A to Yan, filed Jun. 2, 2021, *Hanwha Solutions Corporation et al v. REC Solar Pte. Ltd.* (10 pages).

IPR 2021-00989, Exhibit 1116—CN Patent No. CN 102709372A to Liu, filed Jun. 2, 2021, *Hanwha Solutions Corporation et al v. REC Solar Pte. Ltd.* (10 pages).

IPR 2021-00989, Exhibit 1117—Certified translation of CN Patent No. CN 102709372A to Liu, filed Jun. 2, 2021, *Hanwha Solutions Corporation et al v. REC Solar Pte. Ltd.* (13 pages).

(56) References Cited

OTHER PUBLICATIONS

IPR 2021-00989, Exhibit 1118—U.S. Patent App. Pub. No. 2013/0098423A1 to Shimasaki et al, filed Jun. 2, 2021, *Hanwha Solutions Corporation et al v. REC Solar Pte. Ltd.* (18 pages).

IPR 2021-00989, Exhibit 1119—U.S. Patent App. Pub. No. 2013/0284241A1 to Georgi et al, filed Jun. 2, 2021, *Hanwha Solutions Corporation et al v. REC Solar Pte. Ltd.* (18 pages).

IPR 2021-00989, Exhibit 1120—DE 20 2012 004 526 U1 to SolarWorld Innovations GmbH, filed Jun. 2, 2021, *Hanwha Solutions Corporation et al v. REC Solar Pte. Ltd.* (27 pages).

IPR 2021-00989, Exhibit 1121—Certified Translation of DE 20 2012 004 526 U1 to SolarWorld Innovations GmbH, filed Jun. 2, 2021, *Hanwha Solutions Corporation et al v. REC Solar Pte. Ltd.* (47 pages).

IPR 2021-00989, Exhibit 1122—Mitsubishi Electric Photovoltaic Modules Data Sheet, filed Jun. 2, 2021, *Hanwha Solutions Corporation et al v. REC Solar Pte. Ltd.* (2 pages).

IPR 2021-00989, Exhibit 1123—Japan Patent Pub. No. JP 2013-048166 to Hamada, filed Jun. 2, 2021, *Hanwha Solutions Corporation et al v. REC Solar Pte. Ltd.* 26 pages).

IPR 2021-00989, Exhibit 1124—Certified Translation of Japan Patent Pub. No. JP 2013-048166 to Harada, filed Jun. 2, 2021, *Hanwha Solutions Corporation et al v. REC Solar Pte. Ltd.* (57 pages).

IPR 2021-00989, Exhibit 1125—Cunningham, "Reaching Grid Parity Using BP Solar Crystalline Silicon Technology: A Systems Class Application," Dec. 2010, filed Jun. 2, 2021 (99 pages).

IPR 2021-00989, Exhibit 1126—U.S. Patent Appln. Pub. No. 2006/0054212 A1 to Fraas et al, filed Jun. 2, 2021, *Hanwha Solutions Corporation et al v. REC Solar Pte. Ltd.* (16 pages).

IPR 2021-00989, Exhibit 1127—U.S. Patent Appln. Pub. No. 2011/0271999 A1 to Almogy et al, filed Jun. 2, 2021, *Hanwha Solutions Corporation et al v. REC Solar Pte. Ltd.* (52 pages).

IPR 2021-00989, Exhibit 1128—Messenger, R.A. et al, Photovoltaic Systems Engineering, Third Ed., CRC Press, 2011, Sep. 2011, filed Jun. 2, 2021, *Hanwha Solutions Corporation et al v. REC Solar Pte. Ltd.* (28 pages).

IPR 2021-00989, Exhibit 1129—STMicroelectronics NV, "How to choose a bypass diode for a silicon panel junction box," AN3432, Sep. 2011, filed Jun. 2, 2021, *Hanwha Solutions Corporation et al v. REC Solar Pte. Ltd.* (24 pages).

IPR 2021-00989, Exhibit 1132—EP Patent Pub. No. 2 341 717 A1 to di Vinadio et al, filed Jun. 2, 2021, *Hanwha Solutions Corporation et al v. REC Solar Pte. Ltd.* (10 pages).

IPR 2021-00989, Exhibit 1131—U.S. Patent Appln. Pub. No. 2012/0318319 A1 to Pinarbasi et al, filed Jun. 2, 2021, *Hanwha Solutions Corporation et al v. REC Solar Pte. Ltd.* (19 pages).

IPR 2021-00989, Exhibit 1132—U.S. Patent Appln. Pub. No. 2012/0274389 A1 to Ger et al, filed Jun. 2, 2021, *Hanwha Solutions Corporation et al v. REC Solar Pte. Ltd.* (8 pages).

IPR 2021-00989, Exhibit 1136—Amended Claims from Pending CN App. No. 47409 filed Oct. 6, 2021, *Hanwha Solutions Corporation et al v. REC Solar Pte. Ltd.* (2 pages).

IPR 2021-00989, Exhibit 1137—JP Patent Pub. No. 2010-165993 to Ito, filed Jun. 2, 2021, *Hanwha Solutions Corporation et al v. REC Solar Pte. Ltd.* (12 pages).

IPR 2021-00989, Exhibit 1138—Certified translation JP Patent Pub. No. 2010-165993 to Ito, filed Jun. 2, 2021, *Hanwha Solutions Corporation et al v. REC Solar Pte. Ltd.* (18 pages).

IPR 2021-00989, Exhibit 1145—Solarex Data sheet MSX-60 and MX-64 Photovoltaic Modules, filed Jun. 23, 2022, *Hanwha Solutions Corporation et al v. REC Solar Pte. Ltd.* (4 pages).

IPR 2021-00989, Exhibit 1146—Solarex Datasheet re Mega Modules Over 39 Watts, filled Jun. 23, 2022, *Hanwha Solutions Corporation et al v. REC Solar Pte. Ltd.* (6 pages).

IPR 2021-00989, Exhibit 1147—Solarex Datasheet re BP MSX 120, filed Jun. 23, 2022, *Hanwha Solutions Corporation et al v. REC Solar Pte. Ltd.* (4 pages).

IPR 2021-00989, Exhibit 1148—Suniva Datasheet, filed Jun. 23, 2022, *Hanwha Solutions Corporation et al v. REC Solar Pte. Ltd.* (2 pages).

IPR 2021-00989, Exhibit 1149—Annotated Yagiura Figures, filed Jun. 23, 2022, *Hanwha Solutions Corporation et al v. REC Solar Pte. Ltd.* (3 pages).

IPR 2021-00989, Exhibit 1150—Modified and Annotated Wu Figures, filed Jun. 23, 2022, *Hanwha Solutions Corporation et al v. REC Solar Pte. Ltd.* (1 page).

IPR 2021-00989, Exhibit 1154—Reply Declaration of Jonathan Kimball, Ph.D., on Behalf of Petitioners, filed Jun. 23, 2022, *Hanwha Solutions Corporation et al v. REC Solar Pte. Ltd.* (99 pages).

IPR 2021-00989, Exhibit 1155—Production and Manufacturing Engineering Technologies for Solar Photovoltaic Modules, Li, Post & Telecom Press (2012), filed Jun. 23, 2022, *Hanwha Solutions Corporation et al v. REC Solar Pte. Ltd.* (36 pages).

IPR 2021-00989, Exhibit 1156—English-language translation of Production and Manufacturing Engineering Technologies for Solar Photovoltaic Modules, Li, Post & Telecom Press (2012), filed Jun. 23, 2022, *Hanwha Solutions Corporation et al v. REC Solar Pte. Ltd.* (60 pages).

IPR 2021-00989, Exhibit 1157—Excerpt of Williams, A.F., The Handbook of Photovoltaic Applications, Building Applications and System Design Considerations, The Fairmont Press, Inc., filed Jun. 23, 2022, *Hanwha Solutions Corporation et al v. REC Solar Pte. Ltd.* (12 pages).

IPR 2021-00989, Exhibit 1158—Wayback Letter to Exhibitor, Inter Solar Award (2015), filed Jun. 23, 2022, *Hanwha Solutions Corporation et al v. REC Solar Pte. Ltd.* (6 pages).

IPR 2021-00989, Exhibit 1159—Press Release, Inter Solar Europe, Munich, (Jun. 2015), filed Jun. 23, 2021, *Hanwha Solutions Corporation et al v. REC Solar Pte. Ltd.* (4 pages).

IPR 2021-00989, Exhibit 1160—Excerpt from Lackie, J. (1986), Chambers Dictionary of Science and Technology, filed Jun. 23, 2021, *Hanwha Solutions Corporation et al v. REC Solar Pte. Ltd.* (3 pages).

IPR 2021-00989, Exhibit 1161—JP Patent No. 4925844 to Yagiura, filed Jun. 23, 2022, *Hanwha Solutions Corporation et al v. REC Solar Pte. Ltd.* (15 pages).

IPR 2021-00989, Exhibit 1162—English-language translation of JP Patent No. 4925844 to Yagiura in IPR 2021-00988, filed Jun. 23, 2022, *Hanwha Solutions Corporation et al v. REC Solar Pte. Ltd.* (16 pages).

IPR 2021-00989, Exhibit 1163—CN Patent No. 101013731 to Yagiura, filed Jun. 23, 2022, *Hanwha Solutions Corporation et al v. REC Solar Pte. Ltd.* (22 pages).

IPR 2021-00989, Exhibit 1164—Certified English translation of CN Patent No. 101013731 to Yagiura, filed Jun. 23, 2022, *Hanwha Solutions Corporation et al v. REC Solar Pte. Ltd.* (28 pages).

IPR 2021-00989, Exhibit 1165—Pictures of SunWize Technologies SW-S85P Photovoltaic Module, filed Jun. 23, 2022, *Hanwha Solutions Corporation et al v. REC Solar Pte. Ltd.* (13 pages).

IPR 2021-00989, Exhibit 1166—Excerpt from Deambi, S. (2015), A Practical Handbook on Solar Photovoltaic Applications, The Energy and Resources Institute, 3rd. Ed., filed Jun. 23, 2022, *Hanwha Solutions Corporation et al v. REC Solar Pte. Ltd.* (30 pages).

IPR 2021-00989, Exhibit 1167—Excerpt from Sears, et al (1987), Current, Resistance, and Electromotive Force, University Physics, 7th Ed., filled Jun. 23, 2022, *Hanwha Solutions Corporation et al v. REC Solar Pte. Ltd.* (52 pages).

IPR 2021-00989, Exhibit 1168—BP Solar BP3280T Datasheet, filed Jun. 23, 2022, *Hanwha Solutions Corporation et al v. REC Solar Pte. Ltd.* (2 pages).

IPR 2021-00989, Exhibit 1170—Bosch Solar Module c—Si M 60+ Datasheet, filed Jun. 23, 2022, *Hanwha Solutions Corporation et al v. REC Solar Pte. Ltd.* (2 pages).

IPR 2021-00989, Exhibit 1171—Mitsubishi Electric Photovoltaic Modules, filed Jun. 23, 2022, *Hanwha Solutions Corporation et al v. REC Solar Pte. Ltd.* (2 pages).

(56) References Cited

OTHER PUBLICATIONS

IPR 2021-00989, Exhibit 1172—Excerpt of McGraw Hill, Dictionary of Electronic and Computer Engineering (2003), filed Jun. 23, 2022, *Hanwha Solutions Corporation et al v. REC Solar Pte. Ltd.* (3 pages).
IPR 2021-00989, Exhibit 1173—Excerpt from Wiley Electrical and Electronics Engineering Dictionary (2004), IEEE Press, filed Jun. 23, 2022, *Hanwha Solutions Corporation et al v. REC Solar Pte. Ltd.* (4 pages).
IPR 2021-00989, Exhibit 1174—CN Patent No. 202111130 to Huang, filed Jun. 23, 2022, *Hanwha Solutions Corporation et al v. REC Solar Pte. Ltd.* (9 pages).
IPR 2021-00989, Exhibit 1175—English-language translation of CN Patent No. 202111130 to Huang, filed Jun. 23, 2022, *Hanwha Solutions Corporation et al v. REC Solar Pte. Ltd.* (13 pages).
IPR 2021-00989, Exhibit 1176—CN Patent No. 201742341 to Huang, filed Jun. 23, 2022, *Hanwha Solutions Corporation et al v. REC Solar Pte. Ltd.* (7 pages).
IPR 2021-00989, Exhibit 1177—English-language translation of CN Patent No. 201742341 to Huang, filed Jun. 23, 2022, *Hanwha Solutions Corporation et al v. REC Solar Pte. Ltd.* (9 pages).
IPR 2021-00989, Exhibit 1187—Email to REC's Counsel re Exhibits 1112 and 1113 dated Jul. 21, 2021, filed Aug. 31, 2022, *Hanwha Solutions Corporation et al v. REC Solar Pte. Ltd.* (1 page).
IPR 2021-00989, Exhibit 2001—Text of Hanwha's Request for Invalidation of CN Appl. No. 201400038577.X, filed Sep. 16, 2021, *Hanwha Solutions Corporation et al v. REC Solar Pte. Ltd.* (54 pages).
IPR 2021-00989, Exhibit 2002—Certified English Translation of Hanwha's Request for Invalidation of CN Appl. No. 201400038577.X, filed Sep. 16, 2021, *Hanwha Solutions Corporation et al v. REC Solar Pte. Ltd.* (30 pages).
IPR 2021-00989, Exhibit 2004—Certified English Translation of Decision on Hanwha's Request for Invalidation of CN Appl. No. 201400038577.X, filed Sep. 16, 2021, *Hanwha Solutions Corporation et al v. REC Solar Pte. Ltd.* (24 pages).
IPR 2021-00989, Exhibit 2006—Complaint filed by Hanwhat Q Cells USA, Inc., ITC No. 337-TA-3369, filed Sep. 16, 2021, *Hanwha Solutions Corporation et al v. REC Solar Pte. Ltd.* (57 pages).
IPR 2021-00989, Exhibit 2007—Complaint for Patent Infringement, Case No. 20:cv-01622, D.Del, filed Sep. 16, 2021, *Hanwha Solutions Corporation et al v. REC Solar Pte. Ltd.* (16 pages).
IPR 2021-00988, Exhibit 2008—Defendant's Responses and Objecttions to Plaintiff's First Set of Interrogatorries, filed Jun. 25, 2021, *Hanwha Solutions Corporation et al v. REC Solar Pte. Ltd.* (24 pages).
IPR 2021-00989, Exhibit 2009—Press Release, Hanwha Q Cells Media Statement Regarding REC Group patent infringement lawsuit (2020), filed Sep. 16, 2021, *Hanwha Solutions Corporation et al v. REC Solar Pte. Ltd.* (2 pages).
IPR 2021-00989, Exhibit 2011—Hearing Transcript in *Nuance Comunications, Inc. v. MModal, LLC* (Case No. CA No. 17-1484, D. Del.), Apr. 8, 2019, Motion to Stay Hearing, filed Sep. 16, 2021, *Hanwha Solutions Corporation et al v. REC Solar Pte. Ltd.* (34 pages).
IPR 2021-00989, Exhibit 2015—Press Release, Press Release, Intersolar Award 2015 winner in the category "Photovoltaics" with their REC TwinPeak Series (2017), filled Oct. 13, 2021, *Hanwha Solutions Corporation et al v. REC Solar Pte. Ltd.* (2 pages).
IPR 2021-00989, Exhibit 2016—Peschel, T. (2015), REC Solar wins Intersolar Award with TwinPeak module, filed Oct. 13, 2021, *Hanwha Solutions Corporation et al v. REC Solar Pte. Ltd.* (2 pages).
IPR 2021-00989, Exhibit 2018—Excerpt from Alexander, C.K., et al (2007). Fundamentals of Electric Circuits, Third Ed., McGraw Hill (60 pages).
IPR 2021-00989, Exhibit 2019—Bridge Circuit Diagram, filed Oct. 13, 2021, *Hanwha Solutions Corporation et al v. REC Solar Pte. Ltd.* (1 page).
IPR 2021-00989, Exhibit 2021—Messenger, R.A. et al (2010), Photovoltaic Systems Engineering, Third Ed., CRC Press, filed Mar. 23, 2022, *Hanwha Solutions Corporation et al v. REC Solar Pte. Ltd.* (490 pages).
IPR 2021-00989, Exhibit 2022—Deposition of Jonathan Kimball, Ph.D., taken Mar. 11, 2022, filed Mar. 23, 2022, *Hanwha Solutions Corporation et al v. REC Solar Pte. Ltd.* (57 pages).
IPR 2021-00989, Exhibit 2023—Press Release, REC Launches High-Performance TwinPeak Series Solar Panels for Major Rooftop Markets Worldwide (2014) filed Mar. 23, 2022, *Hanwha Solutions Corporation et al v. REC Solar Pte. Ltd.* (1) page).
IPR 2021-00989, Exhibit 2024—Press Release, Intersolar 2015: REC Showcases Excellence With New Products, New Applications and New Budding Markets (2015) filed Mar. 23, 2022, *Hanwha Solutions Corporation et al v. REC Solar Pte. Ltd.* (1 page).
IPR 2021-00989, Exhibit 2025—The Intersolar Award—Powering the Future With Innovation (2021), https://www.intersolar-award.com/en/?print=1&cHash=b1fe1ba83f77d39dff19f3b1202c8e84, filed Mar. 23, 2022, *Hanwha Solutions Corporation et al v. REC Solar Pte. Ltd.* (3 pages).
IPR 2021-00989, Exhibit 2026—Beetz, B. (2022), Sonnenstromfabrik plans 300MW solar module line in Germany with patented REC tech, PV Magazine, filed Mar. 23, 2022, *Hanwha Solutions Corporation et al v. REC Solar Pte. Ltd.* (5 pages).
IPR 2021-00989, Exhibit 2027—Claim Chart, Nexus Between Intersolar Award Winning REC TwinPeak Series and U.S. Pat. No. 10,749,060, filed Mar. 23, 2022, *Hanwha Solutions Corporation et al v. REC Solar Pte. Ltd.* (77 pages).
IPR 2021-00989, Exhibit 2028—Datasheet for REC TwinPeak Series, filed Mar. 23, 2022, *Hanwha Solutions Corporation et al v. REC Solar Pte. Ltd.* (2 pages).
IPR 2021-00989, Exhibit 2029—Whitepaper, The new REC TwinPeak Series: The combination of different technologies maximizes the power from a polycristalline platform and optimizes long term panel performance (undated), filed Mar. 23, 2022, *Hanwha Solutions Corporation et al v. REC Solar Pte. Ltd.* (2 pages).
IPR 2021-00989, Exhibit 2030—The REC TwinPeak Series: Innovative module design gives improved yield performance in shaded conditions (undateD), filed Mar. 23, 2022, *Hanwha Solutions Corporation et al v. REC Solar Pte. Ltd.* (2 pages).
IPR 2021-00989, Exhibit 2031—EP Patent No. 3 017 520 B1 to Sridhara et al, filed Mar. 23, 2022, *Hanwha Solutions Corporation et al v. REC Solar Pte. Ltd.* (18 pages).
IPR 2021-00989, Exhibit 2032—Communication of notices of opposition pursuant to Rule 79(1) EPC dated Aug. 2, 2021, filed Mar. 23, 2022, *Hanwha Solutions Corporation et al v. REC Solar Pte. Ltd.* (2 pages).
IPR 2021-00989, Exhibit 2034—Joint Press Release, REC Group and Sonnenstromfabrik to expand their cooperation (2022), filed Mar. 23, 2022, *Hanwha Solutions Corporation et al v. REC Solar Pte. Ltd.* (2 pages).
IPR 2021-00989, Exhibit 2035—Vieira, R.G. et al (2020), A comprehensive review on bypass diode application on photovoltaic modules, Energies, vol. 13, 2472, filed Mar. 23, 2022, *Hanwha Solutions Corporation et al v. REC Solar Pte. Ltd.* (22 pages).
IPR 2021-00989, Exhibit 2036—U.S. Patent Appln. Pub. No. 2016/0118935 to Posbic et al, filed Mar. 23, 2022, *Hanwha Solutions Corporation et al v. REC Solar Pte. Ltd.* (12 pages).
IPR 2021-00989, Exhibit 2037, BP 7175 Datasheet, filed Mar. 23, 2022, *Hanwha Solutions Corporation et al v. REC Solar Pte. Ltd.* (2 pages).
IPR 2021-00989, Exhibit 2038—Q.Peak Duo BLK-G10+ Datasheet, filed Mar. 23, 2022, *Hanwha Solutions Corporation et al v. REC Solar Pte. Ltd.* (2 pages).
IPR 2021-00989, Exhibit 2039—Canadian Solar, Installation Manual of Standard Solar Modules (2020), Canadian Solar, Inc, filed Mar. 23, 2022, *Hanwha Solutions Corporation et al v. REC Solar Pte. Ltd.* (47 pages).
IPR 2021-00989, Paper No. 1, Petitioner's Power of Attorney filed Jun. 2, 2021, *Hanwha Solutions Corporation et al v. REC Solar Pte. Ltd.* (3 pages).

(56) References Cited

OTHER PUBLICATIONS

IPR 2021-00989, Paper No. 10—Patent Owner's Sur-Reply in Support of Patent Owner's Preliminary Response filed Oct. 13, 2021, *Hanwha Solutions Corporation et al v. REC Solar Pte. Ltd.* (18 pages).
IPR 2021-00989, Paper No. 12, Decision Granting Institution of Inter Partes Review dated Dec. 13, 2021, *Hanwha Solutions Corp. et al v. REC Solar Pte. Ltd.* (33 pages).
IPR 2021-00989, Paper No. 2, Petitioner's Fee Authorization, filed Jun. 2, 2021, *Hanwha Solutions Corporation et al v. REC Solar Pte. Ltd.* (1 page).
IPR 2021-00989, Paper No. 22, Patent Owner's Response filed Mar. 23, 2022 *Hanwha Solutions Corp. et al v. REC Solar Pte. Ltd.* (64 pages).
IPR 2021-00989, Paper No. 26, Petitioner's Reply filed Jun. 3, 2022, *Hanwha Solutions Corporation et al v. REC Solar Pte. Ltd.* (38 pages).
IPR 2021-00989, Paper No. 3, Petitioner's Petition Ranking and Explanation of Differences filed Jun. 2, 2021, *Hanwha Solutions Corporation et al v. REC Solar Pte. Ltd.* (6 pages).
IPR 2021-00989, Paper No. 30, Patent Owner's Sur-Reply filed Aug. 3, 2022, *Hanwha Solutions Corporation et al v. REC Solar Pte. Ltd.* (34 pages).
IPR 2021-00989, Paper No. 36, Patent Owner's Demonstratives filed Sep. 1, 2022, *Hanwha Solutions Corporation et al v. REC Solar Pte. Ltd.* (177 pages).
IPR 2021-00989, Paper No. 36, Patent Owner's Demonstrative Exhibits filed Sep. 1, 2022, *Hanwha Solutions Corporation et al v. REC Solar Pte. Ltd.* (100 pages).
IPR 2021-00989, Paper No. 39, Record of Oral Hearing Held Sep. 13, 2022, *Hanwha Solutions Corporation et al v. REC Solar Pte. Ltd.* (127 pages).
IPR 2021-00989, Paper No. 4, Petition for Inter Partes Review of U.S. Pat. No. 10,749,060 Challenging Claims 1-6, 11, and 13, IPR 2021-00989, *Hanwha Solutions Corporation et al v. REC Solar Pte. Ltd.* (78 pages).
Paper No. 40, Judgment and Final Written Decision, IPR 2021-00989, filed Sep. 16, 2021, *Hanwha Solutions Corporation et al v. REC Solar Pte. Ltd.* (20 pages).
IPR 2021-00989, Paper No. 7, Patent Owner's Mandatory Notices filed Jun. 17, 2021, *Hanwha Solutions Corporation et al v. REC Solar Pte. Ltd.* (4 pages).
IPR 2021-00989, Paper No. 8, Patent Owner's Preliminary Response filed Sep. 16, 2021, *Hanwha Solutions Corporation et al v. REC Solar Pte. Ltd.* (38 pages).
IPR 2021-00989, Paper No. 9, Petitioner's Reply to Patent Owner's Preliminary Response filed Oct. 6, 2021, *Hanwha Solutions Corporation et al v. REC Solar Pte. Ltd.* (38 pages).
Notification of Reasons for Refusal issued Jun. 7, 2022 by the Japan Patent Office in corresponding Application No. JP 2021-119586 (11 pages).
Kumar, Manish et al, Performance assessment and degration analysis of solar photovoltaic technologies: A review; Renewable and Sustainable Energy Reviews; vol. 78 (2017), pp. 554-587.
Lu, Fei et al; Improved PV Module Performance under Partial Shading Conditions; Proceedings of a meeting held Oct. 23-25, 2012, Singapore, Energy Procedia, vol. 33, 2013, pp. 248-255, DOI 10.1016/j.egypro.2013.05.065 (8 pages).
Mitsubishi Electric Photovoltaic Modules, Nov. 2012, 16 pages.
"MLE Series 265WP PV-MLE265HD Photovoltaic Modules", Mitsubishi Electric Solar Innovations, 2 pages.
"MLU Series 255WP PV-MLU255HC Photovoltaic Modules", Mitsubishi Electric Solar Electric Innovations, 2 pages.
"MLU Series 260 WP PV-MLU260HC Photovaltaic Modules", Mitsubishi Electric Solar Electric Innovations, 2 pages.
Non-Final Office Action issued for U.S. Appl. No. 16/863,492, for Solar Cell Assembly, mailed Mar. 31, 2022 (12 pages).
Notification of Reasons Refusal issued by the Japan Patent Office in Applicaton No. JP 2016-522888 mailed Jan. 8, 2019 (7 pages).
Notification of Reasons Refusal issued by the Japan Patent Office in Applicaton No. JP 2016-522888 mailed Jan. 5, 2018 (11 pages).
Office Action and English-language translation of First Office Action issued by the China Patent Office for Applicaton No. CN 201780038577 mailed Jul. 27, 2017 (12 pages).
Office Action and English-language translation of Second Office Action issued by the China Patent Office for Applicaton No. CN 201780038577 mailed May 31, 2018 (12 pages).
Office Action issued by the Canadian Patent Office for Application No. CA 2916582 mailed Nov. 15, 2018 (4 pages).
Office Action issued by the Canadian Patent Office for Application No. CA 2916582 mailed Dec. 6, 2017 (4 pages).
Communication Pursuant to Article 94(3) EPC issued Jun. 21, 2019 in corresponding European Application No. EP 14765996 (4 pages).
Communication Pursuant to Article 94(3) EPC issued Jan. 3, 2019 in corresponding European Application No. EP 14765996 (5 pages).
Communication Pursuant to Article 94(3) EPC issued Aug. 15, 2018, in corresponding European Applicatoin No. EP 14765996 (8 pages).
Communication Pursuant to Article 94(3) EPC issued Jun. 26, 2018 in corresponding European Application No. EP 14765996 (7 pages).
Communication Pursuant to Article 94(3) EPC issued Jun. 26, 2018 in corresponding European Application No. EP 14765996 (5 pages).
Communication Pursuant to Article 94(3) EPC issued Dec. 4, 2017, in corresponding European Application No. EP 14765996 (6 pages).
English-language translation of Notice of Opposition on behalf of CS Wismar Gmbh filed in the European Patent Office against European Patent No. 3017520 B1 on Jul. 5, 2021 (36 pages).
English-language translation of Notice of Opposition on behalf of Dominik Stauber filed in the European Patent Office against European Patent No. 3017520 B1 on Jul. 9, 2021 (22 pages).
English-language translation of Notice of Opposition on behalf of CS Wismar Gmbh filed in the European Patent Office against European Patent No. 3017520 B1 on Jul. 14, 2021 (61 pages).
English-language translation of Notice of Opposition on behalf of Hoffmann Eitle Patent—unde Rechtanwalte PartmbB filed in the European Patent Office against European Patent No. 3017520 B1 on Jul. 14, 2021 (12 pages).
English-language translation of Notice of Opposition on behalf of Solarwatt GmbH filed in the European Patent Office against European Patent No. 3017520 B1 on Jul. 13, 2021 (37 pages).
English-language translation of Notice of Opposition on behalf of Thomas Kimpfbeck filed in the European Patent Office against European Patent No. 3017520 B1 on Jul. 5, 2021 (18 pages).
Payne, John C. (1994). The Marine Electrical and Electronics Bible—A Practical Handbook for Cruising Sailors. Adlard Coles Nautical. London, England. pp. 77-83.
Kumar, M and A. Kumar, "Performance Assessment and Degradation Analysis of solar Photovoltaic Technologies: A Review", Renewable and Sustainable Energy Reviews, Oct. 1, 2017, pp. 554-587.
Search from TW 103122989 completed Nov. 8, 2017.
Search Report from GB 1312207 2 mailed Dec. 10, 2013.
Fraas, L. & Partain, L. (2010). Solar Cells and Their Applications, 2nd Ed.; Wiley Series in Microwave and Optical Engineering, pp. 161-164.
Stauth, et al., A Distributed Photovolatic energy Optimization System Based on a Sub-Module Pesonant Switched- Capacitor Implementation, Power Electronics and Motion Control Conference 2012, Sep. 4, 2012.
Substantive Examination Report from MY PI 2015704616 mailed Mar. 29, 2019.
Supplemental Invalidity Form and Reasons from related CN Application No. 201480038577, mailed Jul. 30, 2020, 54 pages.
Datasheet of 280W Photovoltaic module "BP 3280T;" BP Solar; undated (2 pages).
Communication Pursuant to Article 94(3) EPC issued by the European Patent Office Jun. 21, 2019 in corresponding Application No. 14765996.5 (4 pages).
Bosch Solar Module c—Si M 60+ S EU56117, Bosch Solar Energy AG; Apr. 2013 (2 pages).
"BP Utility Series", BP Solar, 2011, 2 pages.
Combined Search and Examination Report from GB 1312207 2 mailed Jan. 20, 2014.

(56) References Cited

OTHER PUBLICATIONS

English-language translation of Terrestrial photovoltaic modules with silicon solar cells, DIN EN 61215; Oct. 1996 (26 pages).
Exhibit 1001—U.S. Pat. No. 10,749,060 B2 to Sridhara et al in IPR 2021-00988, filed Jun. 2, 2021, *Hanwha Solutions Corporation et al v. REC Solar Pte. Ltd.* (17 pages).
Exhibit 1002—File History for U.S. Pat. No. 10,749,060 in IPR 2021-00988 (Part 1 of 2), filed Jun. 2, 2021, *Hanwha Solutions Corporation et al v. REC Solar Pte. Ltd.* (726 pages).
Exhibit 1002—File History for U.S. Pat. No. 10,749,060 in IPR 2021-00988 (Part 2 of 2), filed Jun. 2, 2021, *Hanwha Solutions Corporation et al v. REC Solar Pte. Ltd.* (1,098 pages).
Exhibit 1004—China Patent App. Pub. No. 202585481U to Huang in IPR 2021-00988, filed Jun. 2, 2021, *Hanwha Solutions Corporation et al v. REC Solar Pte. Ltd.* (8 pages).
Exhibit 1005, Certified Translation of CN 202585481 to Huang, IPR 2021-00988, filed Jun. 2, 2021, *Hanwha Solutions Corporation et al v. REC Solar Pte. Ltd.* (10 pages).
Exhibit 1006—CN Patent App. Pub. No. 102044587A to Wu in IPR 2021-00988, filed Jun. 2, 2021, *Hanwha Solutions Corporation et al v. REC Solar Pte. Ltd.* (9 pages).
Exhibit 1007—Certified Translation of China Patent Pub. No. CN 102044587A to Wu in IPR 2021-00988, filed Jun. 2, 2021, *Hanwha Solutions Corporation et al v. REC Solar Pte. Ltd.* (11 pages).
Exhibit 1008—China Patent App. Pub. No. 103094381A to Zhang et al in IPR 2021-00988, filed Jun. 2, 2021, *Hanwha Solutions Corporation et al v. REC Solar Pte. Ltd.* (9 pages).
Exhibit 1009—Certified Translation of CN Patent App. Pub. No. 103094381A to Zhang et al in IPR 2021-00988, filed Jun. 2, 2021, *Hanwha Solutions Corporation et al v. REC Solar Pte. Ltd.* (12 pages).
Exhibit 1010—U.S. Pat. No. 8,049,096 B2 to Yagiura et al in IPR 2021-00988, filed Jun. 2, 2021, *Hanwha Solutions Corporation et al v. REC Solar Pte. Ltd.* (21 pages).
Exhibit 1011—U.S. Patent Appln. Pub. No. 2010/0012172 A1 to Meakin et al in IPR 2021-00988, filed Jun. 2, 2021, *Hanwha Solutions Corporation et al v. REC Solar Pte. Ltd.* (22 pages).
Exhibit 1012—Japan Patent Pub. No. JP 2010-165993 to Ito to Hamada in IPR 2021-00988, filed Jun. 2, 2021, *Hanwha Solutions Corporation et al v. REC Solar Pte. Ltd.* (13 pages).
Exhibit 1013—Certified Translation of Japan Patent Pub. No. JP 2010-165993 to Ito to Hamada in IPR 2021-00988, filed Jun. 2, 2021, *Hanwha Solutions Corporation et al v. REC Solar Pte. Ltd.* (13 pages).
Exhibit 1014—China Patent App. Pub. No. 102024865 A to Yan et al in IPR 2021-00989, filed Jun. 2, 2021, *Hanwha Solutions Corporation et al v. REC Solar Pte. Ltd.* (8 pages).
Exhibit 1015—Certified Translation of China Patent Pub. No. CN 102024865A to Yan in IPR 2021-00988, filed Jun. 2, 2021, *Hanwha Solutions Corporation et al v. REC Solar Pte. Ltd.* (10 pages).
Exhibit 1016—China Patent App. Pub. No. 102709372A to Liu to Hamada in IPR 2021-00988, filed Jun. 2, 2021, *Hanwha Solutions Corporation et al v. REC Solar Pte. Ltd.* (10 pages).
Exhibit 1017—Certified Translation of China Patent App. Pub. No. 102709372A to Liu to Hamada in IPR 2021-00988, filed Jun. 2, 2021, *Hanwha Solutions Corporation et al v. REC Solar Pte. Ltd.* (13 pages).
Exhibit 1018—U.S. Patent Appln. Pub. No. 2013/0098423 A1 to Shimasaki et al in IPR 2021-00989, filed Jun. 2, 2021, *Hanwha Solutions Corporation et al v. REC Solar Pte. Ltd.* (18 pages).
Exhibit 1019—U.S. Patent Appln. Pub. No. 2013/0284241 A1 to Georgi et al in IPR 2021-00988, filed Jun. 2, 2021, *Hanwha Solutions Corporation et al v. REC Solar Pte. Ltd.* (18 pages).
Exhibit 1020—DE 20 2012 004 526 U1 to SolarWorld Innovations GmbH in IPR 2021-00989, filed Jun. 2, 2021, *Hanwha Solutions Corporation et al v. REC Solar Pte. Ltd.* (27 pages).
Exhibit 1021—Certified Translation of DE 20 2012 004 526 U1 to SolarWorld Innovations GmbHin IPR 2021-00988, filed Jun. 2, 2021, *Hanwha Solutions Corporation et al v. REC Solar Pte. Ltd.* (47 pages).
Exhibit 1022—Mitsubishi Electric Photovoltaic Modules Data Sheet, in IPR 2021-00988, filed Jun. 2, 2021, *Hanwha Solutions Corporation et al v. REC Solar Pte. Ltd.* (2 pages).
Exhibit 1023—Japan Patent Pub. No. JP 2013-048166 to Hamada in IPR 2021-00988, filed Jun. 2, 2021, *Hanwha Solutions Corporation et al v. REC Solar Pte. Ltd.* 26 pages).
Exhibit 1024—Certified Translation of Japan Patent Pub. No. JP 2013-048166 to Hamada in IPR 2021-00988, filed Jun. 2, 2021, *Hanwha Solutions Corporation et al v. REC Solar Pte. Ltd.* (57 pages).
Exhibit 1025—Cunningham, "Reaching Grid Parity Using BP Solar Crystalline Silicon Technology: A Systems Class Application," Dec. 2010 in IPR2021-00988 filed Jun. 2, 2021 (99 pages).
Exhibit 1026—U.S. Patent Appln. Pub. No. 2006/0054212 A1 to Fraas et al in IPR 2021-00989, filed Jun. 2, 2021, *Hanwha Solutions Corporation et al v. REC Solar Pte. Ltd.* (16 pages).
Exhibit 1027—U.S. Patent Appln. Pub. No. 2011/0271999 A1 to Almogy et al in IPR 2021-00988, filed Jun. 2, 2021, *Hanwha Solutions Corporation et al v. REC Solar Pte. Ltd.* (52 pages).
Exhibit 1028—Messenger, R.A et al, Photovoltaic Systems Engineering, Third Ed., CRC Press, 2011, Sep. 2011in IPR 2021-00988, filed Jun. 2, 2021, *Hanwha Solutions Corporation et al v. REC Solar Pte. Ltd.* (28 pages).
Exhibit 1029—STMicroelectronics NV. "How to choose a bypass diode for a silicon panel junction box," AN3432, Sep. 2011n IPR 2021-00988, filed Jun. 2, 2021, *Hanwha Solutions Corporation et al v. REC Solar Pte. Ltd.* (24 pages).
Exhibit 1030—European Patent Pub. No. 2 341 717 A1 to di Vinadio et al in IPR 2021-00988, filed Jun. 2, 2021, *Hanwha Solutions Corporation et al v. REC Solar Pte. Ltd.* (10 pages).
Exhibit 1031—U.S. Patent Appln. Pub. No. 2012/0318319 A1 to Pinarbasi et al in IPR 2021-00988, filed Jun. 2, 2021, *Hanwha Solutions Corporation et al v. REC Solar Pte. Ltd.* (19 pages).
Exhibit 1032—U.S. Patent Appln. Pub. No. 2012/0274389 A1 to Ger et al in IPR 2021-00988, filed Jun. 2, 2021, *Hanwha Solutions Corporation et al v. REC Solar Pte. Ltd.* (8 pages).
Exhibit 1108—CN Patent App. Pub. No. 103094381A to Zhang et al in IPR 2021-00989, filed Jun. 2, 2021, *Hanwha Solutions Corporation et al v. REC Solar Pte. Ltd.* (9 pages).
Exhibit 1109—Certified Translation of CN Patent App. Pub. No. 103094381A to Zhang et al in IPR 2021-00989, filed Jun. 2, 2021, *Hanwha Solutions Corporation et al v. REC Solar Pte. Ltd.* (12 pages).
Exhibit 1110—U.S. Pat. No. 8,049,096 B2 to Yagiura et al in IPR 2021-00989, filed Jun. 2, 2021, *Hanwha Solutions Corporation et al v. REC Solar Pte. Ltd.* (21 pages).
Exhibit 1111—U.S. Patent Appln. Pub. No. 2010/0012172 A1 to Meakin et al in IPR 2021-00989, filed Jun. 2, 2021, *Hanwha Solutions Corporation et al v. REC Solar Pte. Ltd.* (22 pages).
Exhibit 1112—Japan Patent Pub. No. JP 2010-165993 to Ito to Hamada in IPR 2021-00989, filed Jun. 2, 2021, *Hanwha Solutions Corporation et al v. REC Solar Pte. Ltd.* (13 pages).
Exhibit 1113—Certified Translation of Japan Patent Pub. No. JP 2010-165993 to Ito to Hamada in IPR 2021-00989, filed Jun. 2, 2021, *Hanwha Solutions Corporation et al v. REC Solar Pte. Ltd.* (13 pages).
Exhibit 1114—China Patent App. Pub. No. 102024865 A to Yan et al in IPR 2021-00989, filed Jun. 2, 2021, *Hanwha Solutions Corporation et al v. REC Solar Pte. Ltd.* (8 pages).
Exhibit 1115—Certified Translation of China Patent Pub. No. CN 102024865A to Yan in IPR 2021-00989, filled Jun. 2, 2021, *Hanwha Solutions Corporation et al v. REC Solar Pte. Ltd.* (10 pages).
Exhibit 1116—China Patent App. Pub. No. 102709372A to Liu to Hamada in IPR 2021-00989, filed Jun. 2, 2021, *Hanwha Solutions Corporation et al v. REC Solar Pte. Ltd.* (10 pages).
Exhibit 1117—Certified Translation of China Patent App. Pub. No. 102709372A to Liu to Hamada in IPR 2021-00989, filed Jun. 2, 2021, *Hanwha Solutions Corporation et al v. REC Solar Pte. Ltd.* (13 pages).
Exhibit 1118—U.S. Patent Appln. Pub. No. 2013/0098423 A1 to Shimasaki et al in IPR 2021-00989, filed Jun. 2, 2021, *Hanwha Solutions Corporation et al v. REC Solar Pte. Ltd.* (18 pages).

(56) References Cited

OTHER PUBLICATIONS

Exhibit 1119—U.S. Patent Appln. Pub. No. 2012/0318319 A1 to Georgi et al in IPR 2021-00989, filed Jun. 2, 2021, *Hanwha Solutions Corporation et al* v. *REC Solar Pte. Ltd.* (18 pages).

* cited by examiner

100

300

SOLAR CELL ASSEMBLY

CROSS-REFERENCE TO RELATED APPLICATIONS

The present application is a continuation of U.S. application Ser. No. 16/863,492, filed on Apr. 20, 2020, which is a continuation of U.S. application Ser. No. 14/900,942, filed on Dec. 22, 2015, which is a 35 U.S.C. § 371 National Phase Entry of, and claims the benefit of and priority to, International Application No. PCT/2014/001251, filed on Jul. 2, 2014, which claims the benefit of and priority to GB Application No. 1312207.2, filed on Jul. 5, 2013. The contents of all of these applications are expressly incorporated herein by reference in their entireties.

FIELD OF THE INVENTION

The present invention relates to solar cell assemblies and to solar cell modules including such solar cell assemblies.

TECHNICAL BACKGROUND

Solar cells are used to convert sunlight into electricity using a photovoltaic effect. As shown in FIG. 1a, solar cell modules 100 on the basis of crystalline silicon solar cells may typically include 6×10 solar cells 104 of dimensions 15.6×15.6 cm2 which may be arranged in six parallel interconnected solar cell strings. Each string may include ten or twelve mono- or multi-crystalline solar cells that are interconnected in series by copper ribbons 106. The strings in turn may be again connected in series by so-called cross-connectors 105 so that all cells in the module are connected in series. Solar cell modules with for example 4×9, 6×8 or 6×12 solar cells in the same type of configuration are also common.

Under normal operation conditions, all solar cells may be illuminated and operate at their maximum power point of about 0.5 V. The total module voltage thereby adds up to about 30 V for a solar cell module of 6×10 solar cells. Under certain circumstances, however, partial shading of the module can occur. When a solar cell is shaded, the generated electrical current decreases proportionally with the illumination level. Due to the series connection, the cell with the lowest current determines the overall current in the module. In a situation with only one cell being shaded, this would lead to a complete loss of power of the whole module.

To avoid such complete power loss, so-called by-pass diodes 101 may be incorporated into the module. The by-pass diodes are connected in parallel with a certain number of solar cells. In case of shading, only the cells that are in parallel with the same by-pass diode as the shaded cell may be affected by the power loss. The number of by-pass diodes per module is a compromise between the number of cells that should be affected by partial shading and the cost for incorporating the by-pass diodes. Typically, two strings including 20 cells maximum are connected to one by-pass diode. The by-pass diodes may be located in a junction box 102 that serves as a fixture for the cables used to connect the module to neighboring modules. FIG. 1b shows the electrical schematics of a typical module 100 with three by-pass diodes 101 that are mounted in the junction box 102. The strings are connected to the junction box by the cross-connectors 103 and are connected in series with each other by the cross-connectors 105 on the opposite side.

In a partial-shading situation, where only one cell 104 is completely shaded, the by-pass diode short-circuits all cells that are connected in parallel to the diode. In that situation, the illuminated cells still operate between their maximum power point and their open-circuit voltage at about 0.5-0.6 V each, whereas the shaded cell does not generate any voltage. In contrast, the combined voltage of the illuminated cells of 19 times about 0.5-0.6 V leads to a voltage of up to about 11.4 V being applied to the shaded cell in reverse bias direction.

Due to the diode-characteristic of the solar cells, there is only a negligible reverse saturation current flowing when a reverse bias voltage is applied. However, the solar cell can only withstand a certain maximum reverse bias before it comes to avalanche breakdown of the diode which may lead to rapid heat generation and ultimately to the destruction of the solar cell. Even before destruction, local shunts or "hot-spots" may lead to increased heat generation that can damage the module encapsulation and even cause fire.

Therefore, the maximum applied reverse bias voltage should not exceed the breakdown voltage of typically about 13 V. The exact breakdown voltage depends on the wafer material and the cell design of the solar cells. At given open-circuit voltages of the solar cells, the breakdown voltage limits the number of cells that can be connected to one by-pass diode.

The numbers above show that in the conventional module layout with cross-connectors and junction box at the narrow side of the module, the number of cells per by-pass diode is already close to the maximum.

An approach to increase module output power is to reduce the length of the solar cells in the direction of their interconnection with the ribbons 106, typically achieved by cutting the cells in half. By doing so, resistive losses, which show a parabolic dependence on the length of the cells, can effectively be reduced. Power output can be improved by around 2% with such an approach. However, the number of cells in each string doubles and so does the number of cells per by-pass diode.

Another approach may be using half-cut cells and using one by-pass diode for each string, i.e., by incorporating a connector ribbon to connect the one end of the string with the junction box on the opposite side. The drawback of this solution is the power loss of approximately 0.5% in the connector ribbon and the substantial additional cost for the ribbon as well as the necessity to provide multiple back sheet layers where the ribbons are located to avoid shunting.

Therefore, there is a desire to have an optimal cell configuration in solar cell modules such that the maximum reverse breakdown voltages are not exceeded and such that the use of connector ribbons of excessive lengths is avoided.

SUMMARY OF THE INVENTION

A solar cell assembly is presented. The solar cell assembly includes one or more solar cell units coupled in series. The solar cell unit includes a first solar cell series and a second solar cell series connected in parallel. The first and second solar cell series include a plurality of solar cells connecting in series respectively. The solar cell assembly also includes a by-pass diode coupled to each solar cell unit, wherein the by-pass diode is coupled in parallel with the first solar cell series and second solar cell series respectively, i.e. the by-pass diode may be interpreted as being shared between the first and second solar cell series in each solar cell unit.

Objects, along with advantages and features of the present invention herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, the same reference characters generally refer to same or similar parts throughout the different views. Also, the drawings are only schematically and not necessarily to scale, emphasis instead generally being placed upon illustrating the principles of the invention. In the following description, various embodiments are described with reference to the following drawings, in which.

DESCRIPTION OF PREFERRED EMBODIMENTS

Embodiments generally relate to devices, for example, devices for converting energy of light into electrical energy. More particularly, the devices may be solar cell elements or solar cell modules including a plurality of solar cell elements.

Figure 1A:
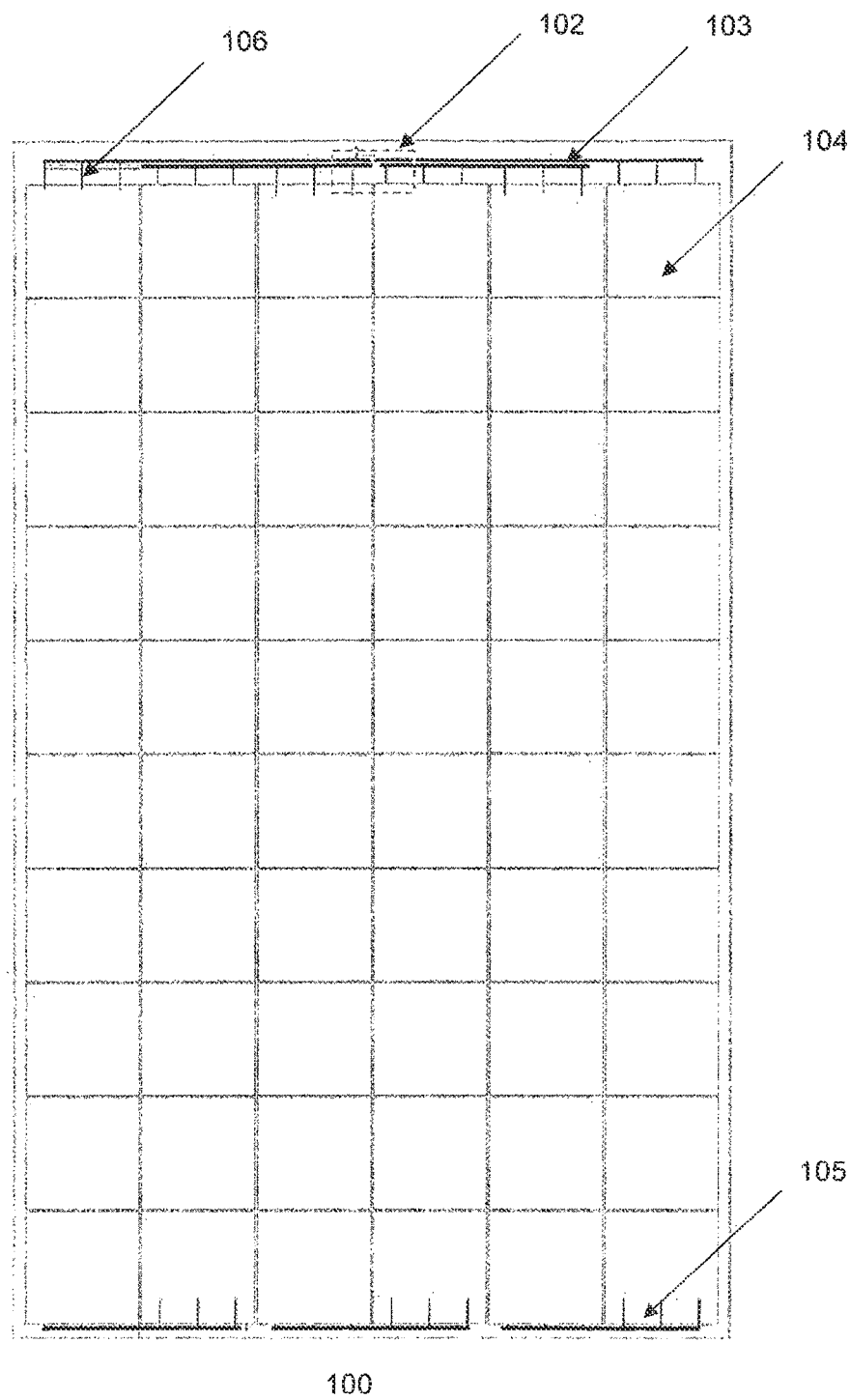
FIGS. 1a-b show a layout of a solar cell module.
Figure 1B:
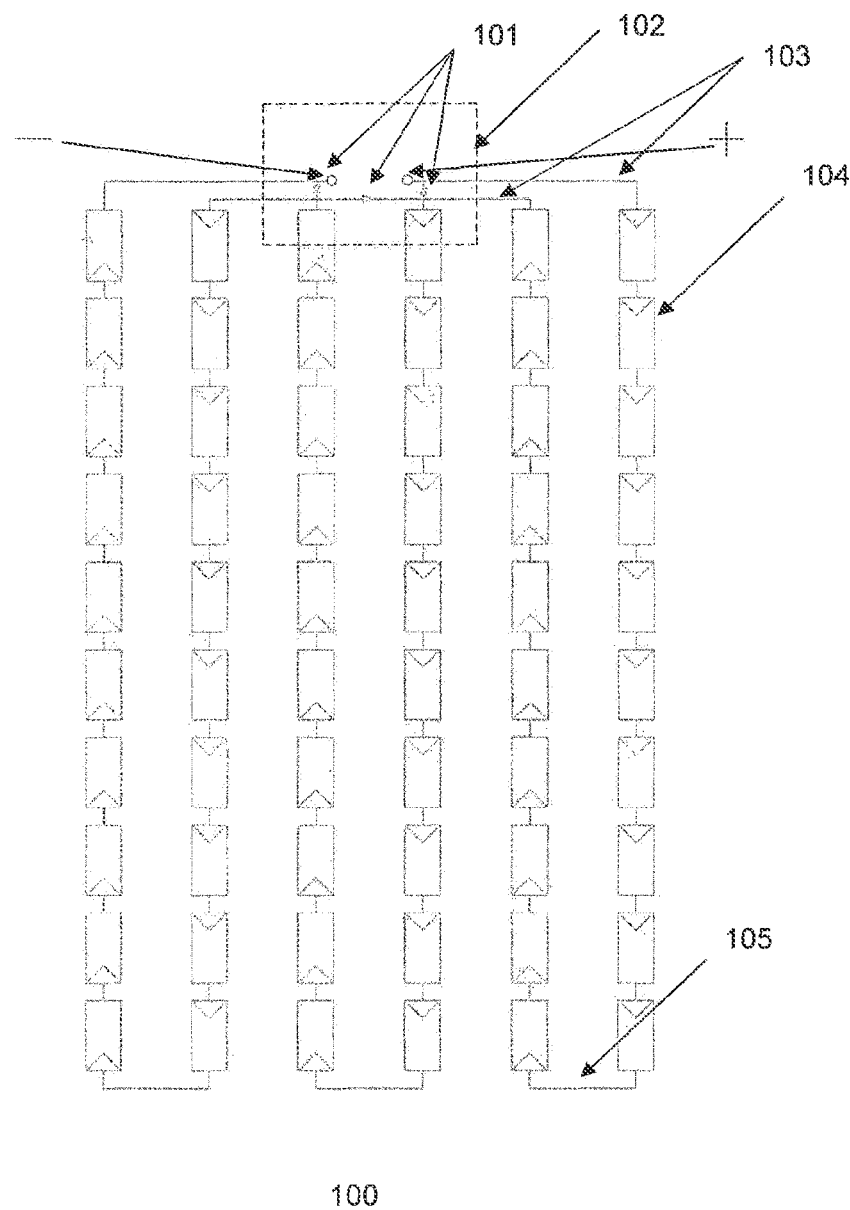
Figure 2A:
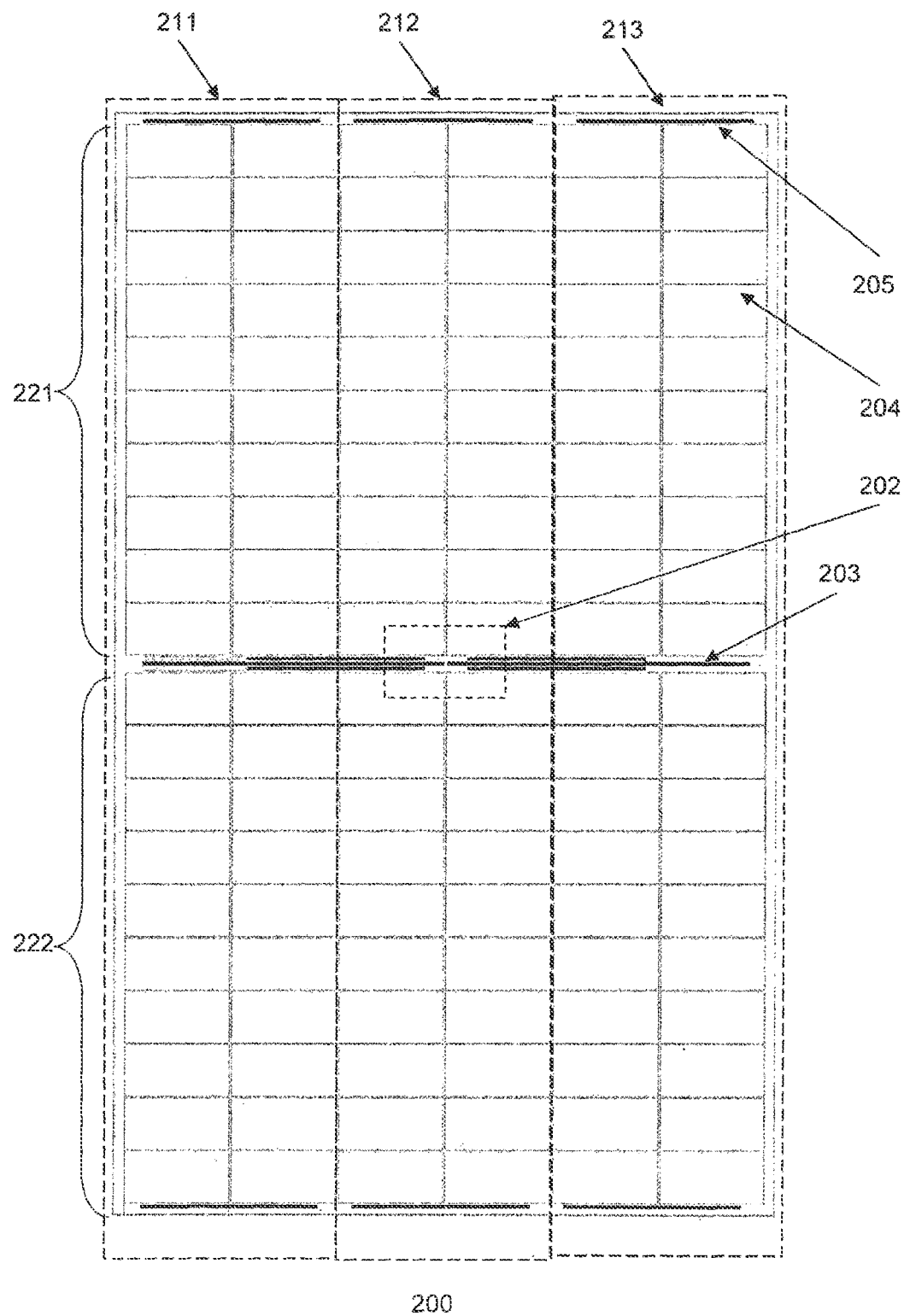
FIGS. 2a-b show an embodiment of a solar cell assembly layout and a corresponding electrical schematic diagram.
Figure 2B:
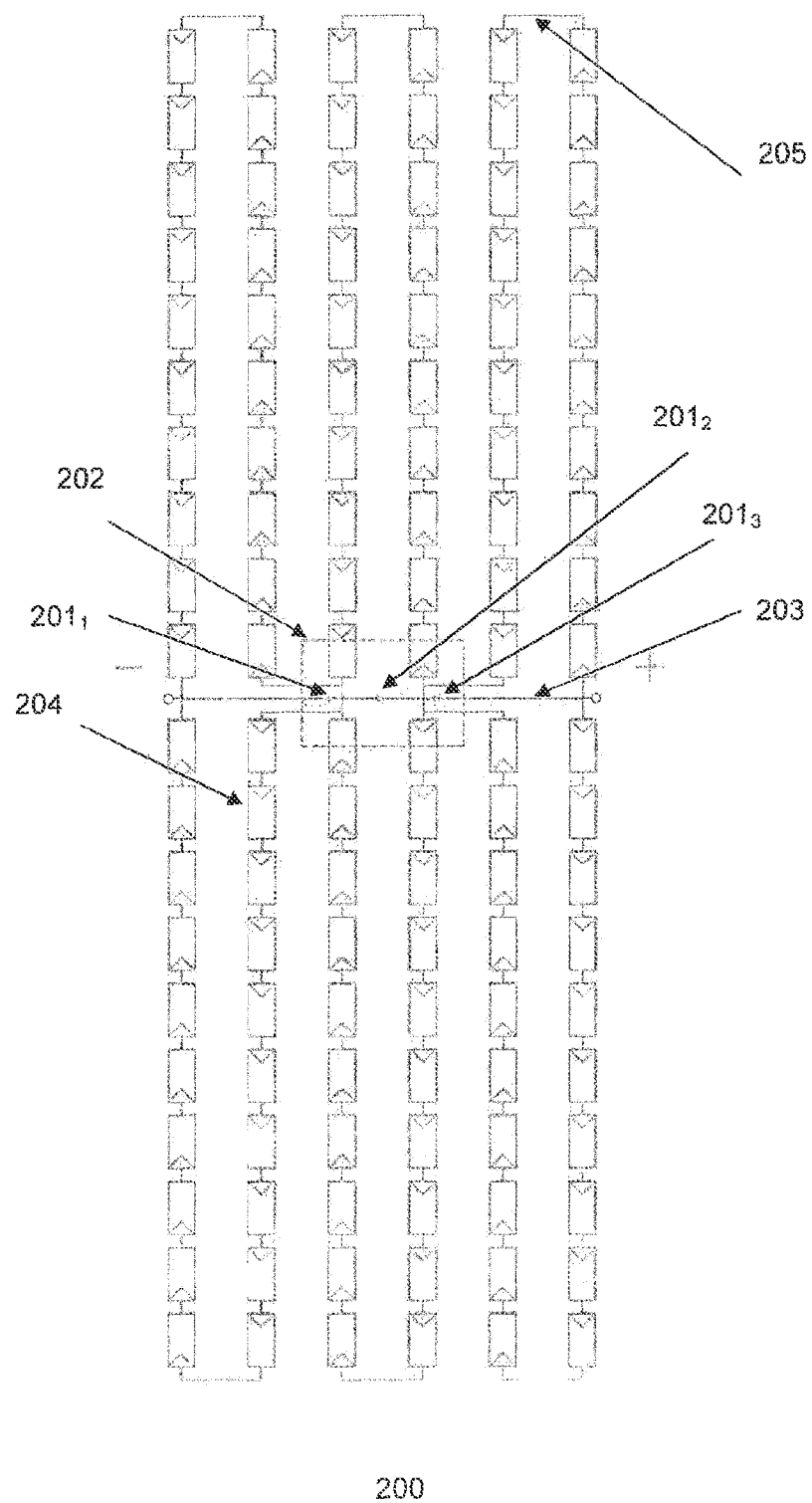

FIG. 2a shows an embodiment of a solar cell assembly layout 200 and FIG. 2b shows a corresponding electrical schematic diagram. In one embodiment, the solar cell assembly is a solar cell module. In another embodiment, the solar cell assembly is a portion of a solar cell module. The solar cell assembly may include solar cells 204 which may be arranged in one or more solar cell units. As illustrated in FIG. 2a, the solar cell assembly 200 includes three solar cell units, for example, a first solar cell unit 211, a second solar cell unit 212 and a third solar cell unit 213. Having solar cell assemblies including another number of solar cell units may also be useful.

In one embodiment, a solar cell unit includes a first solar cell series and a second solar cell series. For example, the first solar cell unit 211 may include a first solar cell series 221 and a second solar cell series 222. Within each of the solar cell series, a plurality of solar cells may be connected in series. For example, for a solar cell assembly in the form of a 6×10 solar cell module, the first solar cell series may include 10 solar cells with 15.6×15.6 cm2 dimensions. The solar cell series may also include other numbers of solar cells, for example, 12 solar cells with 15.6×1.5.6 cm2 dimensions for a 6×12 solar cell module may also be useful. In another embodiment, the solar cell unit includes solar cells cut into a plurality of sections. For example, as shown in FIG. 2a, the solar cells are cut into half and connected in series with each other within each solar cell series. By cutting the solar cells into half, resistive losses, which show a parabolic dependence on the length of the cells, may effectively be reduced. Power output may be improved by about 2%.

In one embodiment, the first and second solar cell series within the same solar cell unit share a same by-pass diode. The by-pass diode may include a semiconductor material, such as silicon, with two terminals attached. The by-pass diode may be used to circumvent destructive effects of hot-spot heating. In one embodiment, the bypass diode is connected in parallel, but with opposite polarity, to a solar cell or a group of solar cells connected in series. Under normal operation, each solar cell in the group may be forward biased and the bypass diode may be reverse biased. However, when a portion of the solar cell group is shaded, the bypass diode may become forward biased and allow the current produced by the unshaded portion to flow through the by-pass diode, thus avoiding the high resistance of the shaded portion and preventing hot-spot heating.

For example, the first and second solar cell series 221 and 222 within the first solar cell unit may share a first by-pass diode 2011. In one embodiment, the first solar cell series is connected in parallel with the second solar cell series which may have substantially the same open circuit voltage, Voc, as the first solar cell series. More particularly, the first and second solar cell series may be mirror images of each other with respect to the first by-pass diode. Other configurations of the first and second solar cell series within one solar cell unit which achieve the same Voc may also be useful. In one embodiment, the first by-pass diode, first solar cell series and second solar cell series are coupled to each other in parallel. In one embodiment, the cathode of the first by-pass diode may be connected to the positive nodes of both the first and second solar cell series, and the anode of the first by-pass diode may be connected to the negative nodes of both the first and second solar cell series. The configurations of the first and second solar cell series and by-pass diodes within other solar cell units may be similar to that within the first solar cell unit.

In one embodiment, the solar cell series are connected with the by-pass diodes via cross-connectors 203. The cross-connectors may be made of conductive materials such as metals, comprising e.g. copper, aluminum, silver or alloys thereof. For example, the cross-connectors may be copper ribbons. Other types of conductive materials may also be used for the cross-connectors.

In one embodiment, the solar cells in a solar cell series are arranged in one or more strings connected in series. For example, for a solar cell assembly having 6×10 solar cells of 15.6×15.6 cm2 dimensions, the first solar cell series in the first solar cell unit may include two strings with each string containing 5 solar cells connected in series. Strings with other numbers of solar cells with other dimensions may also be useful. For example, as shown in FIG. 2a, for a solar cell assembly having 6×20 half-cut solar cells of 15.6×7.8 cm2 dimensions, the first solar cell series in the first solar cell unit may include two strings with each string containing 10 half-cut solar cells connected in series. The two strings within the first solar cell series may be connected in series by cross-connectors 205.

The other solar cell units within the solar cell assembly may have similar configurations of solar cells as that in the first solar cell unit. In one embodiment, the solar cell units are connected to each other in series, provided that they generate substantially the same output current as each other. In one embodiment, the cross-connectors 203 of some or all the solar cell units within the assembly are combined as one central cross-connector assembly and placed substantially in the centre line of the solar cell assembly/module as shown in FIG. 2a. Due to the symmetry of the solar cell assembly, it may not make a difference for the electrical device structure. Therefore, only a small amount of additional cross-connectors is required when compared to the conventional solar cell assembly/module layout, and the additional area required for the cross-connectors 203 and 205 is kept to a minimum. It may be important not to increase the area of the module during production, so that the same equipment may be used for producing conventional modules. In addition, module efficiency may not be sacrificed, which is the module power normalized to the module area and the standard irradiated power.

When all solar cells, for example, in the first solar cell unit 211, operate normally and provide enough current to a load, the first by-pass diode 2011 coupled to the first solar cell unit 211 may be reverse biased, and all cells in the first solar cell unit operate close to a maximum power point (MPP). However, when a portion of the first solar cell unit becomes incapable of generating enough current for the load, for example, when the portion of the first solar cell series is shaded from the sun or even damaged, the shaded or damaged portion may become reverse biased and the first by-pass diode 2011 coupled in parallel may become forward biased to conduct currents. The shaded or damaged first solar cell series may not contribute to the power output of the assembly, while the second solar cell series which are not shaded or damaged may still contribute to the power output of the assembly to a small extent. This embodiment may have better performance than the conventional configurations of the solar cell modules in which all solar cells connected parallel to the by-pass diode contribute no power when the by-pass diode is forward biased.

For example, for a solar cell assembly including 6×20 solar half-cut solar cells, 10 half-cut solar cells are connected in series in one string as shown in FIG. 2a. As the solar cell assembly is divided into three solar cell units with one by-pass diode coupled with one solar cell unit, this configuration allows 40 solar cells per by-pass diode without the maximum applied reverse bias voltage exceeding the breakdown voltage. "Hot-spots" or destruction of solar cells may therefore be reduced.

Figure 5:
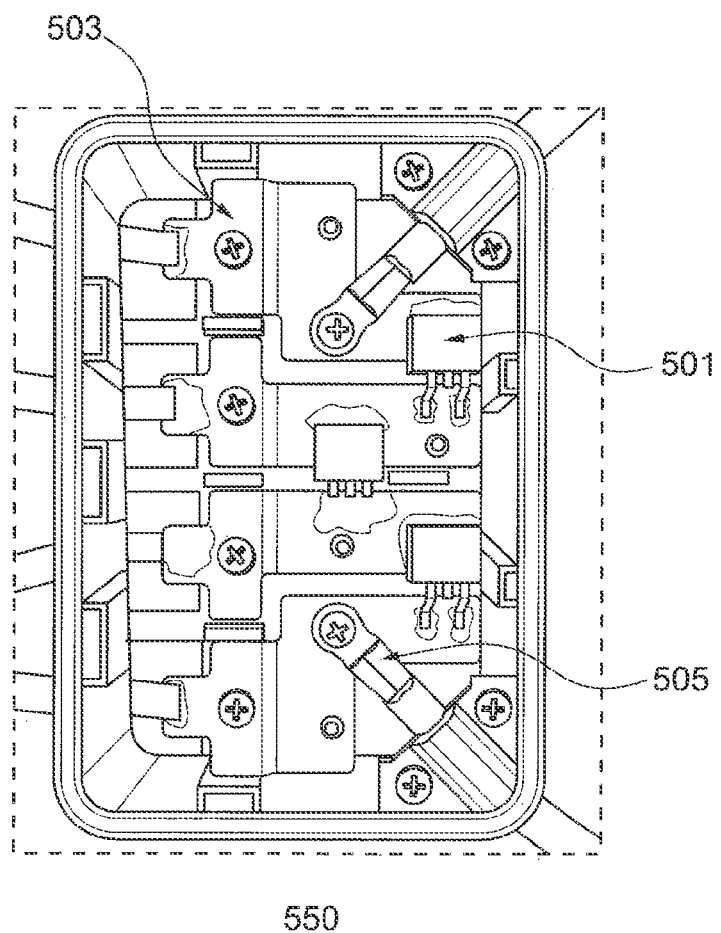
FIG. 5 shows an embodiment of a junction box.

In one embodiment, the by-pass diodes are housed in one or more junction boxes. FIG. 5 shows an embodiment of a junction box 550. The junction box may include at least one by-pass diode 501. The junction box may also include input terminal 503 for electrically coupling to respective solar cell strings and output terminal 505 for coupling to an external device, for example, a power conditioner. In one embodiment, the junction box collects electrical power from both solar cell series within some or all solar cell units and outputs the power to the external device.

In one embodiment, as shown in FIG. 2a, all by-pass diodes in the solar cell assembly are mounted in a single junction box. In another embodiment, a plurality of junction boxes are used with each junction box containing a subset of the by-pass diodes coupled with the solar cell units. For example, equal number of junction boxes as the by-pass diodes may be used with each junction box housing one by-pass diode. As an illustration, three junction boxes may be used to house the three by-pass diodes with each junction box containing one by-pass diode. Other numbers of junction boxes may also be used. For example, two junction boxes may be used with a first junction box housing two by-pass diodes and a second junction box housing one by-pass diode.

In one embodiment, the junction boxes are placed on the rear side of the solar cell assembly. The junction boxes may be disposed substantially in the centre line of the rear side of the solar cell assembly. For example, for a solar cell assembly/module including a single junction box housing all by-pass diodes therein, the junction box may be placed substantially in the middle of the rear side of the solar cell assembly/module. For a solar cell assembly/module including a plurality of junction boxes, the junction boxes may be placed substantially in the centre line of the rear side of the solar cell assembly and substantially equidistant from each other or edges of the assembly/module. Other placements of the junction boxes which minimize the amount of cross-connectors may also be useful.

In yet another embodiment, a subset or all by-pass diodes in the solar cell assembly include integrated by-pass diodes which are integrated in a laminate of the solar cell assembly/module instead of being housed in junction boxes. In one embodiment, a combination of junction boxes and integrated by-pass diodes are used. For example, for a solar cell assembly including three by-pass diodes, a combination of junction boxes and integrated by-pass diodes may be used. More particularly, a second by-pass diode may be an integrated by-pass diode integrated in the laminate of the solar cell assembly/module, while first and third by-pass diodes may be housed in junction boxes together with cross-connectors connecting to external devices or other assemblies/modules. The second by-pass diode may be placed substantially in the middle of the assembly/module while the first and third by-pass diodes may be placed near the edges of the assembly/module.

Figure 6A:
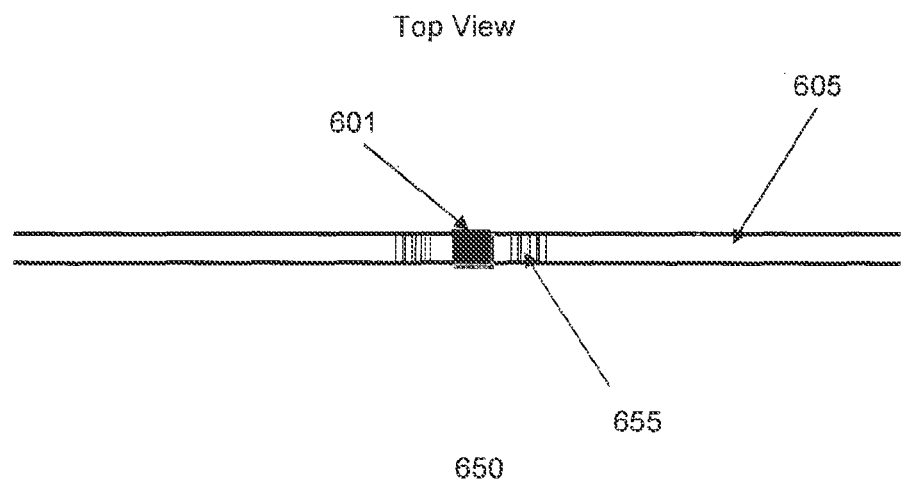
FIGS. 6a-b show an embodiment of a by-pass diode.
Figure 6B:
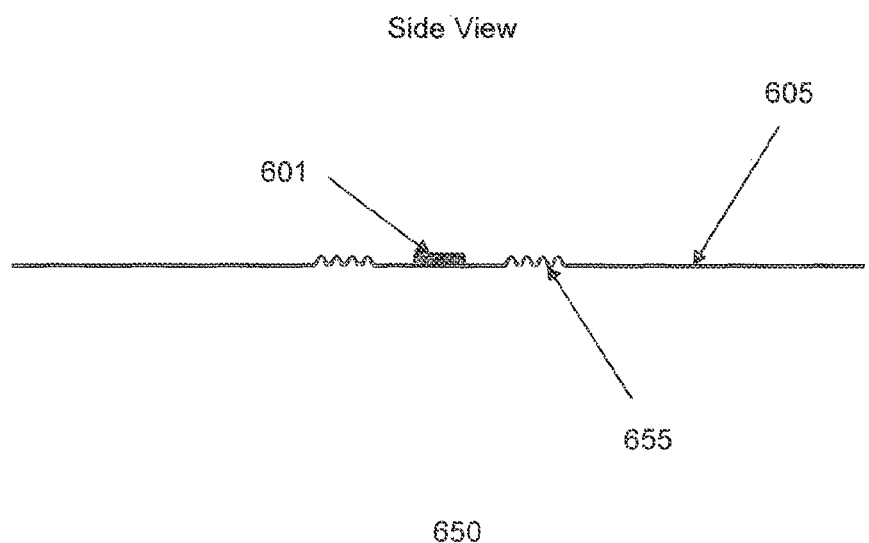

FIGS. 6a-b show an embodiment of an integrated by-pass diode unit 650 for being integrated in the laminate. In one embodiment, the integrated by-pass diode unit includes an integrated by-pass diode 601 and two cross-connectors 605 for coupling to adjacent by-pass diodes or external terminals. The cross-connectors may include corrugation structures 655 as a stress relief to prevent the integrated by-pass diode and a mechanical connection between the integrated by-pass diode and the cross-connectors from cracking due to electrical or mechanical overstresses. Other structures for stress relief purposes may also be incorporated in the integrated by-pass diode unit.

Figure 3A:
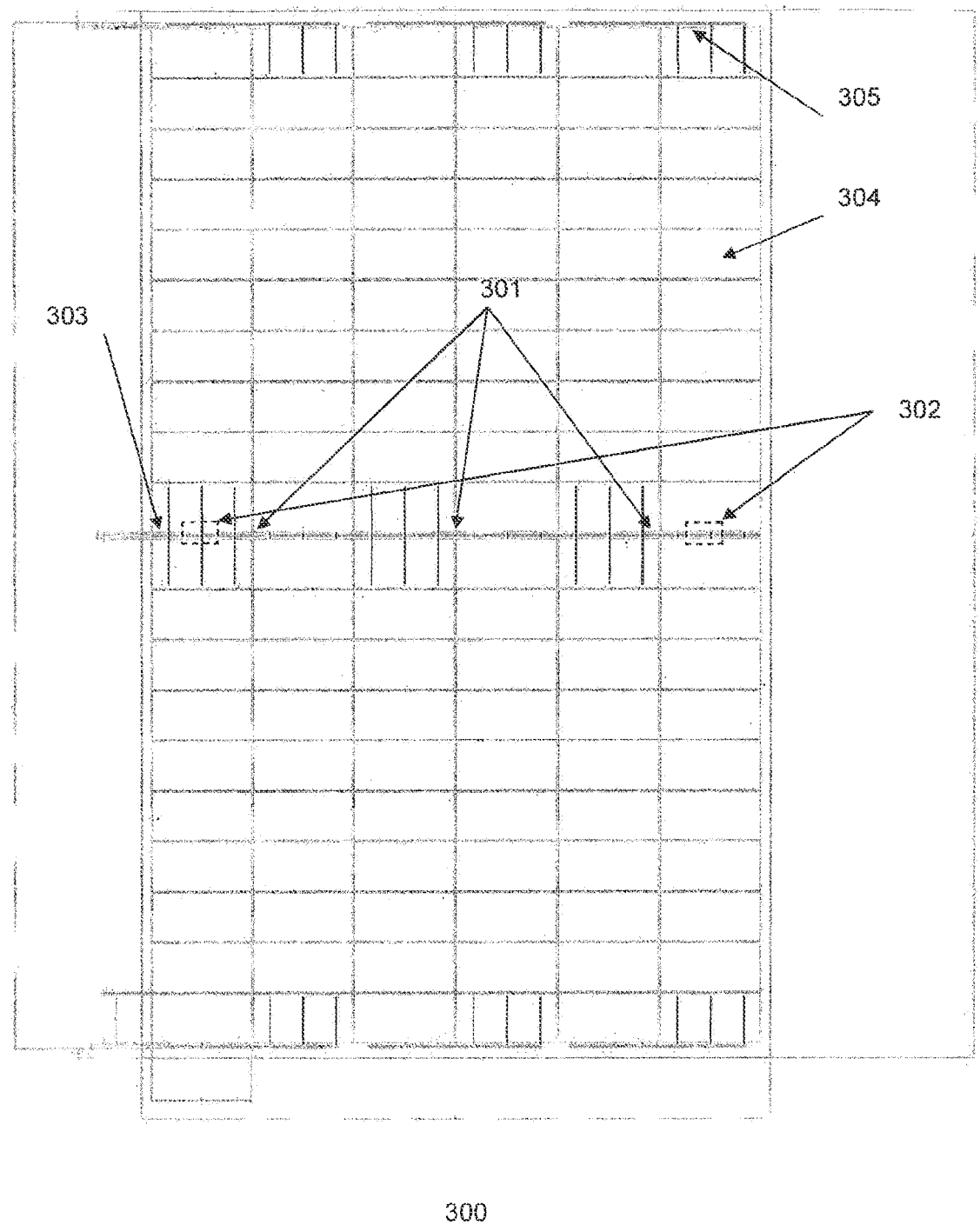
FIGS. 3a-b show another embodiment of a solar cell assembly layout and a corresponding electrical schematic diagram.
Figure 3B:
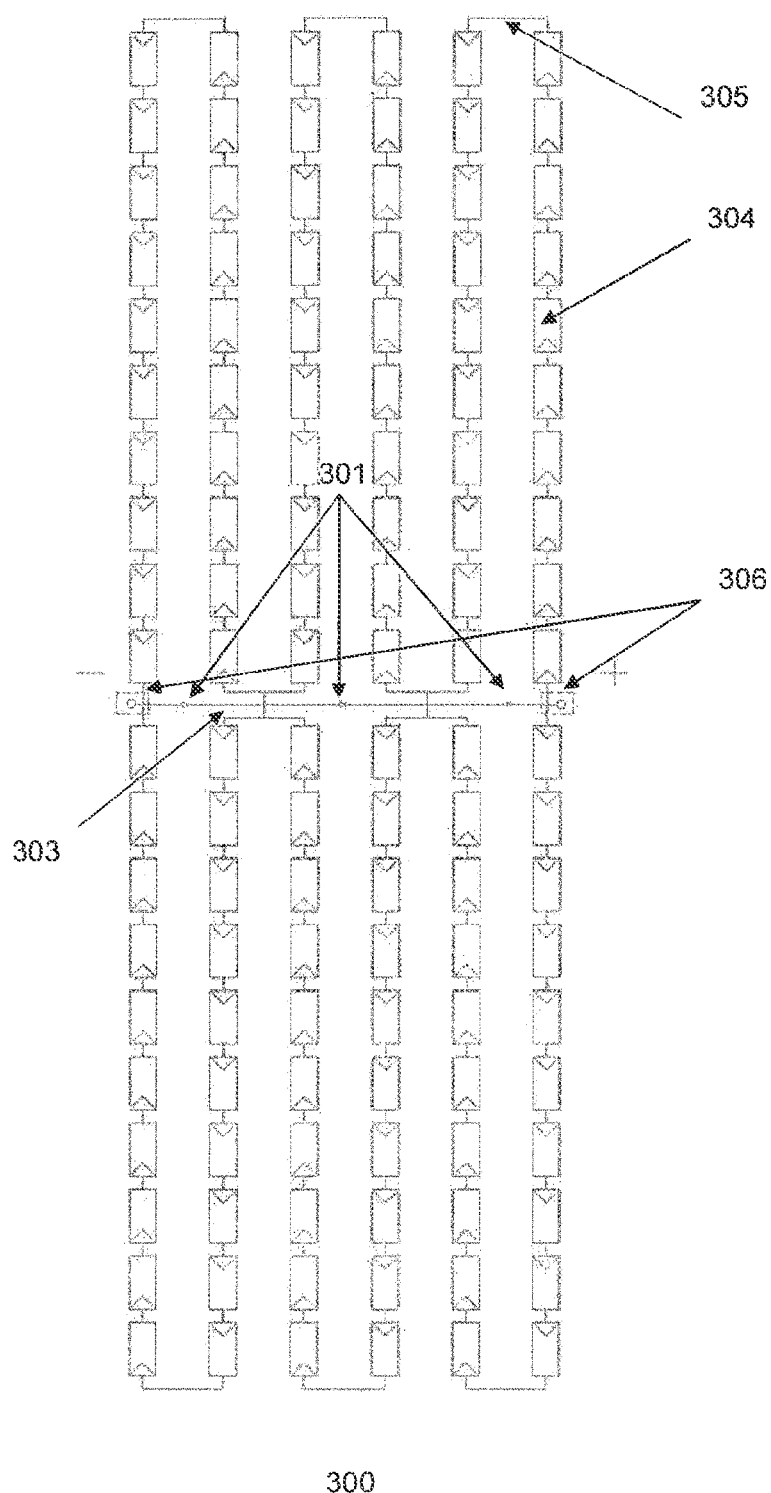

It may be possible that all by-pass diodes in the solar cell assembly are integrated by-pass diodes as shown in FIGS. 3a-b. FIG. 3a shows another embodiment of the solar cell assembly layout 300 and FIG. 3b shows the corresponding electrical schematic diagram. Features in this embodiment which are similar to that described in FIGS. 2a-b will not be described or described in detail. In this embodiment, all by-pass diodes 301 coupled to the solar cell units include integrated by-pass diodes which are integrated into the laminate of the solar assembly/module. In such a case, two integrated by-pass diodes near edges of the module may be connected to two external terminals 302 respectively to connect to an external device or other assemblies/modules. The two external terminals may be disposed in two terminal boxes.

This approach may have the advantage of reducing the length of the cross-connectors and thereby reducing the electrical losses in the cross-connectors, which leads to an increased module power output. On top of the higher power output, the module area may also be reduced which leads to an additional increase in module efficiency. Because the approach requires smaller amount of cross-connectors, cheaper connector terminals and less potting material, it may effectively reduce the module production cost. Since the connector terminals and cables may be located near the edges of the module, connecting the modules in a photovoltaic array may be facilitated. The cables may be shorter compared to the solution with mounted junction boxes shown in FIG. 2a. This may result in reduced resistive losses in the cables, reduced cost and easier handling during installation of the modules. Instead of cable connectors, it may also be possible to integrate connector plugs into the sides of the module frames to reduce the resistive losses further.

Figure 4A:
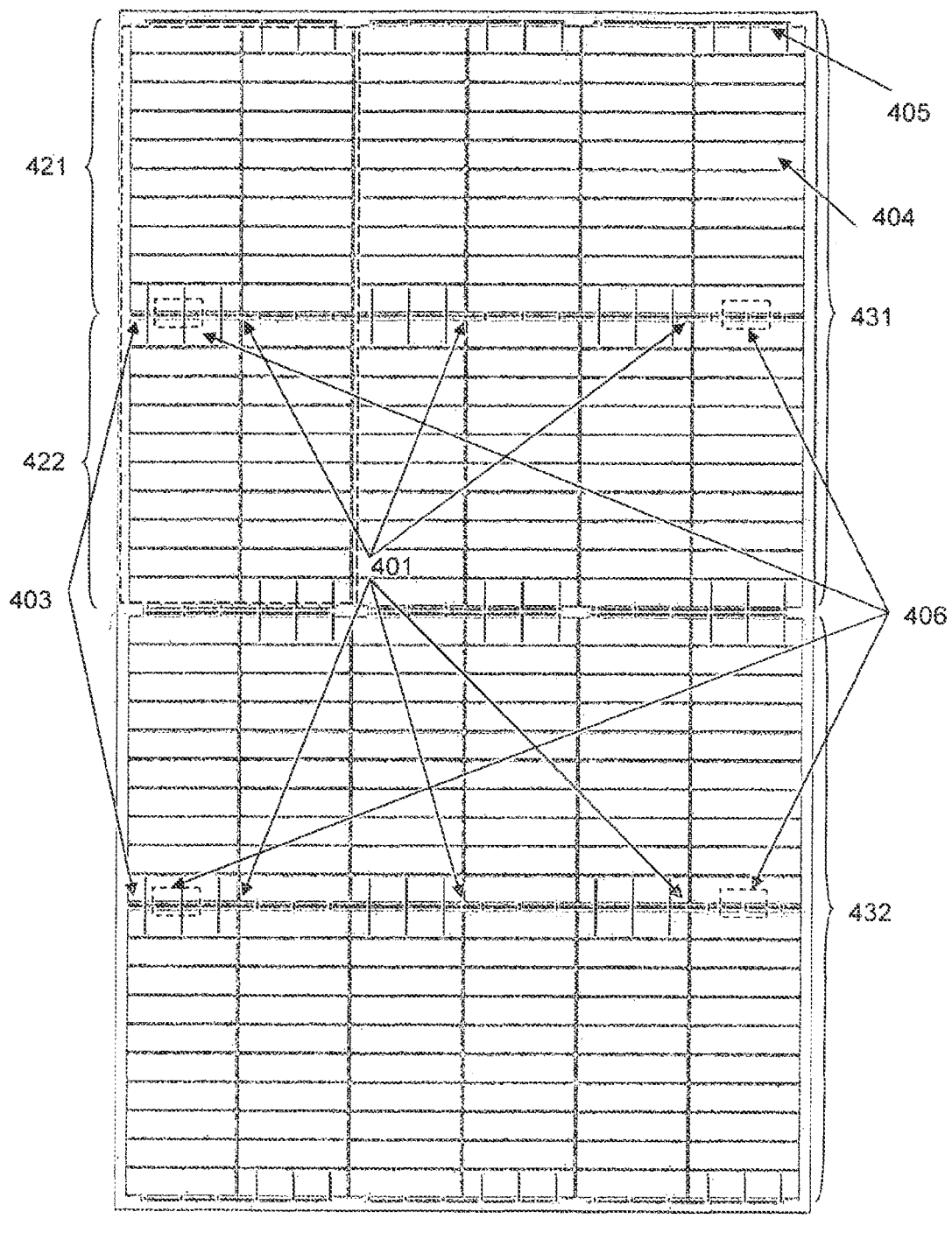
FIGS. 4a-b show yet another embodiment of a solar cell assembly layout and a corresponding electrical schematic diagram.
Figure 4B:
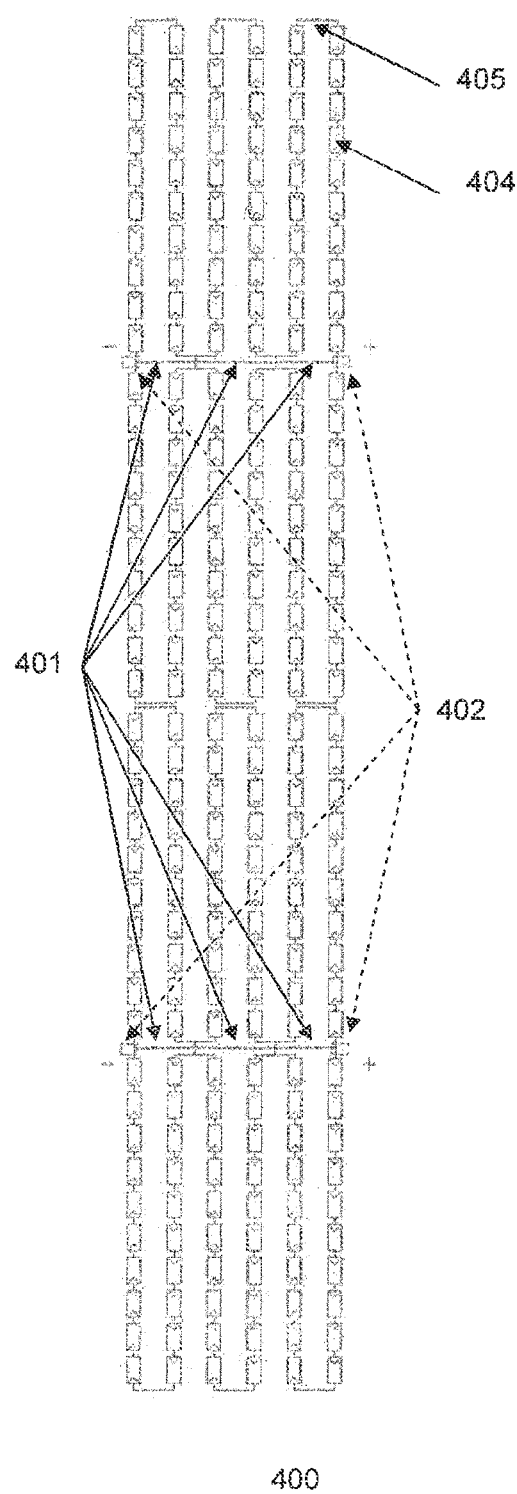

FIG. 4a shows an embodiment of the solar cell module 400 and FIG. 4b shows the corresponding electrical schematic diagram. Features in this embodiment which are similar to that described in FIGS. 3a-b will not be described or described in detail. In one embodiment, the solar cell module includes a first solar cell assembly 431 and a second solar cell assembly 432. The first solar cell assembly 431 includes solar cells of 15.6×3.9 cm2 dimensions. The solar cells may be obtained by cutting solar cells of 15.6×15.6 cm2 dimensions into quarters. The first solar cell assembly may include one or more solar cell units 412 having a first solar cell series 421 and a second solar cell series 422. Within the solar cell series, a plurality of solar cells may be connected in series. For example, for a solar cell assembly with 6×20 solar cells of 15.6×3.9 cm2 dimensions, the first solar cell series may include 20 such solar cells. The first solar cell series may also include other numbers of solar cells, for example, 24 solar cells with 15.6×3.9 cm2 dimensions for a solar cell assembly with 6×24 solar cells of 15.6×3.9 cm2 dimensions. The configurations of the solar cell units may be similar to those described in FIGS. 2a-b and FIGS. 3a-b. For example, the first and second solar cell series with substantially the same Voc may be connected in parallel and share a first by-pass diode 401. More particularly, the first and second solar cell series may be mirror images of each other with respect to the first by-pass diode 401. In one embodiment, the solar cell series are connected with the first by-pass diodes via cross-connectors 403. The cross-connectors 403 of some or all the solar cell units within the first solar cell assembly may be combined as one central cross-connector assembly and placed substantially in the centre line of the first solar cell assembly. In one embodiment, connector terminals 406 are used to couple to the cross-connectors or central cross-connector assembly.

The configurations of the by-pass diodes and cross-connectors included in the solar cell assemblies in FIGS. 4a-b may be similar to those described in FIGS. 2a-b and FIGS. 3a-b.

In one embodiment, two solar cell assemblies are included in one solar cell module as illustrated in FIGS. 4a-b. Other numbers of solar cell assemblies may also be included in the solar cell module depending on the requirements and configurations of the solar cells and modules. The solar cell assemblies within one solar cell module may be connected to each other by one connector that connects the first ends and a second connector that connects the second ends of the solar cell assemblies. This is a design that may be more tolerant to shading than conventional designs of solar cell modules.

The invention may be embodied in other specific forms without departing from the scope of the invention. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

Terms such as "about" in conjunction with a specific distance or size are to be interpreted as not to exclude insignificant deviation from the specified distance or size and may include for example deviations of up to 20%. Furthermore, terms such as "substantially parallel" or "substantially perpendicular" are to be interpreted as not to exclude insignificant deviation from the specified arrangement and may include for example deviations of up to 20°.

Finally, it should be noted that the term "comprising" does not exclude other elements or steps and the "a" or "an" does not exclude a plurality. Also elements described in association with different embodiments may be combined. It should also be noted that reference signs in the claims should not be construed as limiting the scope of the claims.

The invention claimed is:

1. A solar cell assembly comprising:
a first solar cell unit comprising:
a first solar cell series including a plurality of solar cells connected in series;
a second solar cell series, coupled in parallel with the first solar cell series, including a plurality of solar cells connected in series;
a first bypass diode coupled in parallel with the first solar cell series and the second solar cell series; and
a second solar cell unit, coupled in series with the first solar cell unit, comprising:
a third solar cell series including a plurality of solar cells connected in series;
a fourth solar cell series, coupled in parallel with the third solar cell series, including a plurality of solar cells connected in series;
a second bypass diode coupled in parallel with the third solar cell series and the fourth solar cell series, the second bypass diode comprising an integrated bypass diode integrated in a laminate of the solar cell assembly; and
a junction box containing the first bypass diode.

2. The solar cell assembly of claim 1, wherein the plurality of solar cells of each of the first solar cell series, the second solar cell series, the third solar cell series, and the fourth solar cell series comprise half-cut solar cells.

3. The solar cell assembly of claim 1, wherein each of the first solar cell series, the second solar cell series, the third solar cell series, and the fourth solar cell series includes twenty (20) or twenty-four (24) half-cut solar cells.

4. The solar cell assembly of claim 1, further including a plurality of bypass diodes, wherein the plurality of bypass diodes includes the first bypass diode, the second bypass diode, and a third bypass diode, wherein the plurality of bypass diodes are located on the solar cell assembly substantially equidistant from each other and substantially along a centerline extending along a center of the solar cell assembly.

5. The solar cell assembly of claim 4, wherein the plurality of bypass diodes as a group is further equidistant from edges of the solar cell assembly on the centerline.

6. The solar cell assembly of claim 4, wherein the junction box is a first junction box, the solar cell assembly further including a second junction box, wherein the first junction box contains the first bypass diode and the second junction box contains the third bypass diode.

7. The solar cell assembly of claim 6, wherein the solar cell assembly comprises:
a front side having the first solar cell series, the second solar cell series, the third solar cell series, and the fourth solar cell series; and
a rear side having the first junction box and the second junction box.

8. The solar cell assembly of claim 6, wherein the first junction box and the second junction box are located on the solar cell assembly substantially at the centerline of the solar cell assembly.

9. The solar cell assembly of claim 6, further including a plurality of junction boxes, wherein the first junction box and the second junction box are two of the plurality of junction boxes, and the plurality of junction boxes are substantially equidistant from each other along the centerline.

10. The solar cell assembly of claim 9, wherein the plurality of junction boxes as a group is further equidistant from edges of the solar cell assembly on the centerline.

11. The solar cell assembly of claim 4, further including:
a third solar cell unit, coupled in series with the first solar cell unit or the second solar cell unit, comprising:
a fifth solar cell series including a plurality of solar cells connected in series;
a sixth solar cell series, coupled in parallel with the fifth solar cell series, including a plurality of solar cells connected in series; and
the third bypass diode coupled in parallel with the fifth solar cell series and the sixth solar cell series,
wherein the first bypass diode and the third bypass diode are placed near edges of the solar cell assembly, and the second bypass diode is placed substantially at a middle of the solar cell assembly.

12. The solar cell assembly of claim 4, further including:
a third solar cell unit, coupled in series with the first solar cell unit or the second solar cell unit, comprising:
a fifth solar cell series including a plurality of solar cells connected in series;
a sixth solar cell series, coupled in parallel with the fifth solar cell series, including a plurality of solar cells connected in series; and
the third bypass diode coupled in parallel with the fifth solar cell series and the sixth solar cell series,
wherein the second bypass diode and the third bypass diode are placed near edges of the solar cell assembly, and the first bypass diode is placed substantially at a middle of the solar cell assembly.

13. The solar cell assembly of claim 1, wherein the first solar cell series and the third solar cell series are located on a first side of a centerline extending along a center of the solar cell assembly, and the second solar cell series and the fourth solar cell series are located on a second side of the centerline.

14. The solar cell assembly of claim 1, wherein the plurality of solar cells of each of the first solar cell series, the second solar cell series, the third solar cell series, and the fourth solar cell series includes a first solar cell and a last solar cell, and the first solar cell and the last solar cell are located substantially at a centerline of the solar cell assembly that extends along a center of the solar cell assembly.

15. The solar cell assembly of claim 1, further including:
a first cross connector coupling the first solar cell series to the second solar cell series; and
a second cross connector coupling the third solar cell series to the fourth solar cell series,
wherein the first cross connector and the second cross connector are located at a centerline extending along a center of the solar cell assembly.

16. The solar cell assembly of claim 15, wherein the first cross connector and the second cross connector are combined as a single row central cross connector assembly that is placed substantially in the centerline.

17. The solar cell assembly of claim 15, wherein at least one of:
the first cross connector and the second cross connector are combined in a single cross connector assembly; or
the first cross connector further couples the first bypass diode with the first solar cell series and the second solar cell series, and the second cross connector couples the second bypass diode with the third solar cell series and the fourth solar cell series.

18. The solar cell assembly of claim 15, wherein:
each of the first solar cell series, the second solar cell series, the third solar cell series, and the fourth solar cell series comprises a first string and a second string both having an equal number of solar cells,
the solar cell assembly further comprises a third cross connector, a fourth cross connector, a fifth cross connector, and a sixth cross connector respectively connecting the first string to the second string of the first solar cell series, the second string of the second solar cell series, the second string of the third solar cell series, and second string of the fourth solar cell series,
the third cross connector and the fifth cross connector are located substantially at an edge of the solar cell assembly on a first side of the centerline, and
the fourth cross connector and the sixth cross connector are located substantially at the edge of the solar cell assembly on a second side of the centerline.

19. The solar cell assembly of claim 1, wherein the integrated bypass diode is part of an integrated bypass diode unit comprising one or more cross connectors, wherein at least one cross-connector of the one or more cross connectors includes a corrugation structure as a stress relief to prevent a mechanical connection between the integrated bypass diode and the cross connector from cracking due to electrical or mechanical overstresses.

* * * * *